US012635217B2

(12) United States Patent
Lee et al.

(10) Patent No.: US 12,635,217 B2
(45) Date of Patent: May 19, 2026

(54) ISOLATION LAYERS FOR REDUCING LEAKAGES BETWEEN CONTACTS

(71) Applicant: Taiwan Semiconductor Manufacturing Co., Ltd., Hsinchu (TW)

(72) Inventors: Tze-Liang Lee, Hsinchu (TW); Po-Hsien Cheng, Hsinchu (TW); Po-Cheng Shih, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 933 days.

(21) Appl. No.: 17/651,671

(22) Filed: Feb. 18, 2022

(65) Prior Publication Data

US 2023/0154992 A1 May 18, 2023

Related U.S. Application Data

(60) Provisional application No. 63/278,588, filed on Nov. 12, 2021.

(51) Int. Cl.
H10D 30/62 (2025.01)
H10D 30/01 (2025.01)
(Continued)

(52) U.S. Cl.
CPC ......... H10D 64/258 (2025.01); H10D 30/024 (2025.01); H10D 30/6219 (2025.01);
(Continued)

(58) Field of Classification Search
CPC ... H01L 21/311; H01L 21/768; H01L 23/485; H01L 23/522; H10D 30/6219;
(Continued)

(56) References Cited

U.S. PATENT DOCUMENTS

| 5,880,482 A * | 3/1999 | Adesida | .............. | H10F 30/2275 |
| | | | | 257/E31.066 |
| 6,448,600 B1 * | 9/2002 | Schlosser | ........... | H10B 12/0385 |
| | | | | 257/302 |

(Continued)

FOREIGN PATENT DOCUMENTS

| KR | 20160136579 A | 11/2016 |
| KR | 20180078125 A | 7/2018 |

(Continued)

*Primary Examiner* — Mohsen Ahmadi
(74) *Attorney, Agent, or Firm* — Slater Matsil, LLP

(57) ABSTRACT

A structure includes a gate stack over a semiconductor region, a source/drain region on a side of the gate stack, a contact etch stop layer over a part of the source/drain region, an inter-layer dielectric over the contact etch stop layer, a silicide region over the source/drain region, a source/drain contact plug over and contacting the silicide region, and an isolation layer encircling the source/drain contact plug. In a top view of the source/drain contact plug, the source/drain contact plug is elongated, and the isolation layer includes an end portion at an end of the source/drain contact plug, and a middle portion between opposing ends of the source/drain contact plug. An end-portion thickness of the end portion is greater than a middle-portion thickness of the middle portion.

20 Claims, 31 Drawing Sheets

(51) Int. Cl.

| | |
|---|---|
| *H10D 64/01* | (2025.01) |
| *H10D 64/23* | (2025.01) |
| *H10D 84/01* | (2025.01) |
| *H10D 84/03* | (2025.01) |

(52) U.S. Cl.

CPC ....... *H10D 64/021* (2025.01); *H10D 84/0158* (2025.01); *H10D 84/038* (2025.01)

(58) Field of Classification Search

CPC ........ H10D 30/69; H10D 64/01; H10D 64/23; H10D 62/822; H10W 20/033; H10W 20/069; H10W 20/076; H10W 20/082; H10P 50/683

See application file for complete search history.

(56) References Cited

U.S. PATENT DOCUMENTS

| | | | | |
|---|---|---|---|---|
| 9,064,801 | B1 | 6/2015 | Horak et al. | |
| 9,305,835 | B2* | 4/2016 | Alptekin | H10D 64/015 |
| 9,559,184 | B2* | 1/2017 | Ching | H10D 64/017 |
| 9,716,158 | B1* | 7/2017 | Cheng | H10D 84/83 |
| 10,050,149 | B1 | 8/2018 | Huang et al. | |
| 11,271,095 | B2 | 3/2022 | Huang et al. | |
| 11,935,953 | B2 | 3/2024 | Han et al. | |
| 2011/0309433 | A1* | 12/2011 | Shin | H10B 69/00 |
| | | | | 257/324 |
| 2014/0131806 | A1* | 5/2014 | Zhu | H10D 84/0135 |
| | | | | 438/275 |
| 2015/0041869 | A1 | 2/2015 | Pham et al. | |
| 2015/0243582 | A1* | 8/2015 | Klewer | H10D 62/115 |
| | | | | 438/653 |
| 2016/0163861 | A1* | 6/2016 | Park | H10D 62/151 |
| | | | | 257/192 |
| 2016/0343825 | A1* | 11/2016 | Bae | H10D 62/021 |
| 2016/0351663 | A1* | 12/2016 | Park | H10D 30/6217 |
| 2016/0365426 | A1* | 12/2016 | Ching | H01L 21/283 |
| 2017/0077247 | A1 | 3/2017 | Xie et al. | |
| 2018/0190809 | A1 | 7/2018 | Huang et al. | |
| 2019/0103284 | A1* | 4/2019 | Yu | H10D 84/013 |
| 2019/0165124 | A1 | 5/2019 | More et al. | |
| 2020/0043738 | A1* | 2/2020 | Wang | H10D 30/6219 |
| 2020/0043858 | A1 | 2/2020 | Wu et al. | |
| 2020/0135871 | A1 | 4/2020 | Tsai et al. | |
| 2020/0203348 | A1* | 6/2020 | Kim | H10B 12/0335 |
| 2021/0057538 | A1 | 2/2021 | Shin et al. | |
| 2021/0083118 | A1* | 3/2021 | Wu | H10D 30/024 |
| 2021/0134973 | A1* | 5/2021 | Huang | H10D 30/024 |
| 2022/0020742 | A1* | 1/2022 | You | H10D 84/0142 |

FOREIGN PATENT DOCUMENTS

| | | |
|---|---|---|
| KR | 20180127156 A | 11/2018 |
| KR | 20190063360 A | 6/2019 |
| KR | 20200014197 A | 2/2020 |
| KR | 20210032874 A | 3/2021 |
| KR | 20210073142 A | 6/2021 |
| TW | 201537728 A | 10/2015 |

* cited by examiner

ISOLATION LAYERS FOR REDUCING LEAKAGES BETWEEN CONTACTS

PRIORITY CLAIM AND CROSS-REFERENCE

This application claims the benefit of the following provisionally filed U.S. Patent application: Application No. 63/278,588, filed on Nov. 12, 2021, and entitled "Dielectric Deposition to Mitigate Metal-to-Metal Leakage—Asymmetric Thickness of Dielectric Formation," which application is hereby incorporated herein by reference.

BACKGROUND

In the manufacturing of integrated circuits, source/drain contact plugs are used for connecting to the source and drain regions and the gates of transistors. The source/drain contact plugs are typically connected to source/drain silicide regions, whose formation process includes forming contact openings in an inter-layer dielectric, depositing a metal layer extending into the contact openings, and then performing an anneal to react the metal layer with the silicon/germanium of the source/drain regions. The source/drain contact plugs are then formed in the remaining contact openings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
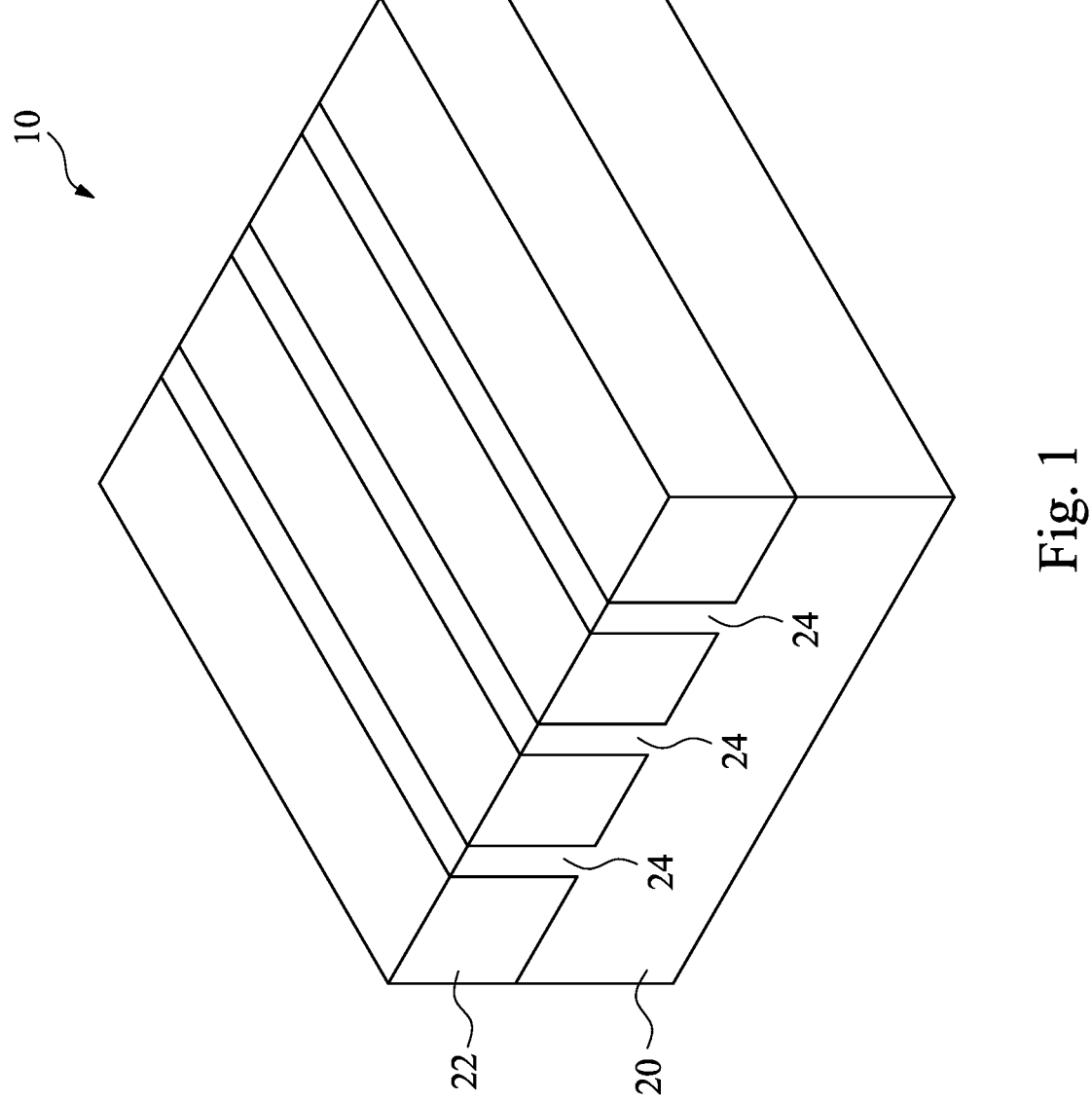
FIGS. 1-4, 5A, 5B, 6, 7, 8A, 8B, 9A, 9B, 10A, 10B, 10C, 11A, 11B, 12A, 12B, 13A, 13B, 14A, 14B, 15A, 15B, 15C, 16A, 16B, 17, and 18 illustrate the cross-sectional views, perspective views and top views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors and the methods of forming the same are provided in accordance with some embodiments. Isolation layers are formed to reduce leakage between neighboring source/drain contact plugs, and between contact plugs and gate contact plugs. In accordance with some embodiments, the formation of Fin Field-Effect Transistors (FinFETs) is used as an example to explain the concept of the present disclosure. Other types of transistors such as planar transistors may also adopt the concept of the present disclosure. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-4, 5A, 5B, 6, 7, 8A, 8B, 9A, 9B, 10A, 10B, 10C, 11A, 11B, 12A, 12B, 13A, 13B, 14A, 14B, 15A, 15B, 15C, 16A, 16B, 17, and 18 illustrate the cross-sectional views and perspective views of intermediate stages in the formation of FinFETs and isolation layers in accordance with some embodiments of the present disclosure. The processes shown in these figures are also reflected schematically in the process flow 200 as shown in FIG. 19.

FIG. 1 illustrates a perspective view of an initial structure formed on wafer 10. Wafer 10 includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 as shown in FIG. 19. The portions of substrate 20 between neighboring STI regions 22 are referred to as semiconductor strips 24. The top surfaces of semiconductor strips 24 and the top surfaces of STI regions 22 may be substantially level with each other in accordance with some embodiments.

In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to regrow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
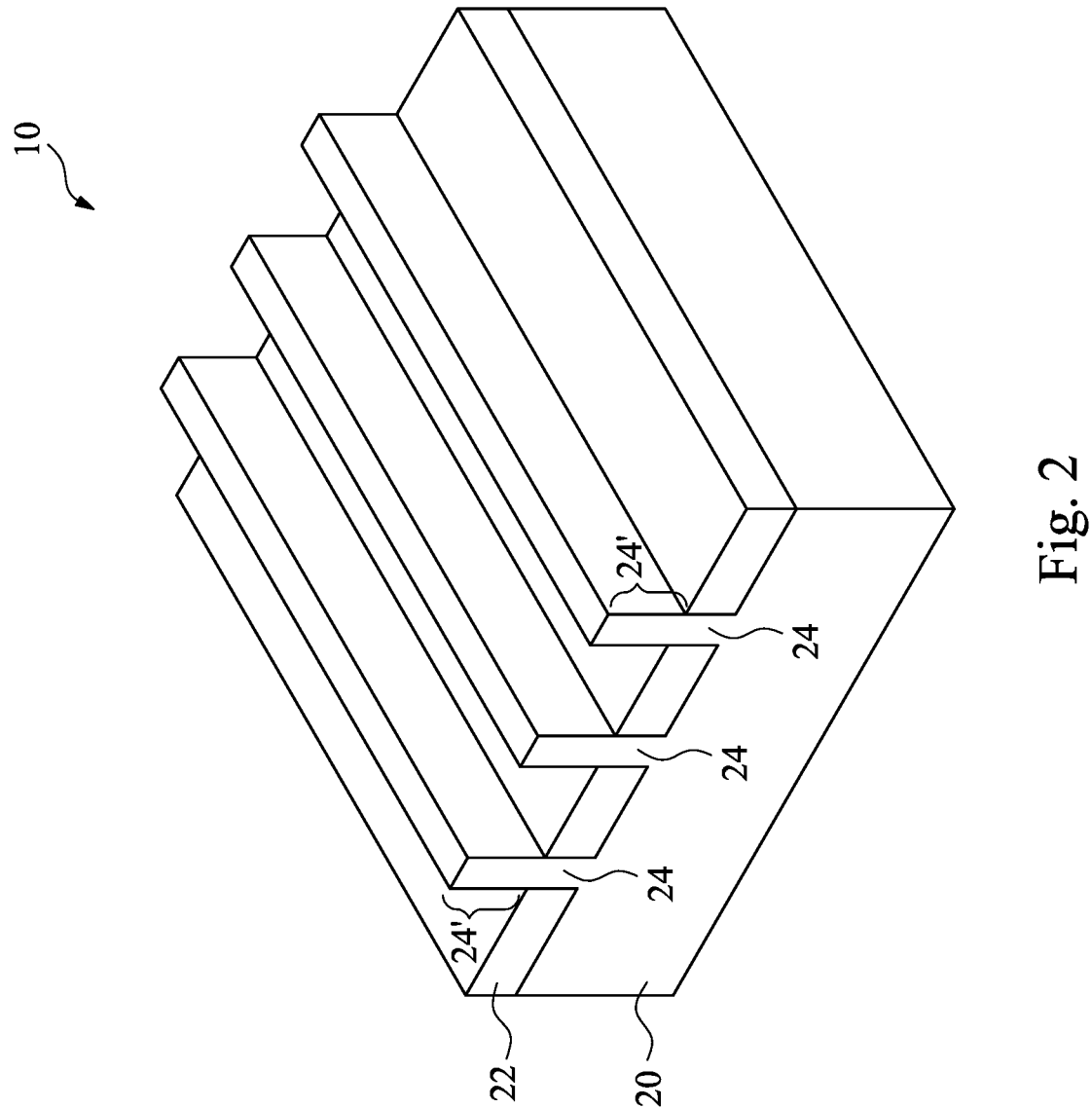

Referring to FIG. 2, STI regions 22 are recessed, so that the top portions of semiconductor strips 24 protrude higher than the top surfaces 22T of the remaining portions of STI regions 22 to form protruding semiconductor fins 24'. The respective process is illustrated as process 204 in the process flow 200 as shown in FIG. 19. The etching may be performed using a dry etching process, wherein HF and NH₃ are used as the etching gases. During the etching process, plasma may be generated. Argon may also be included. In accordance with alternative embodiments of the present disclosure, the recessing of STI regions 22 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
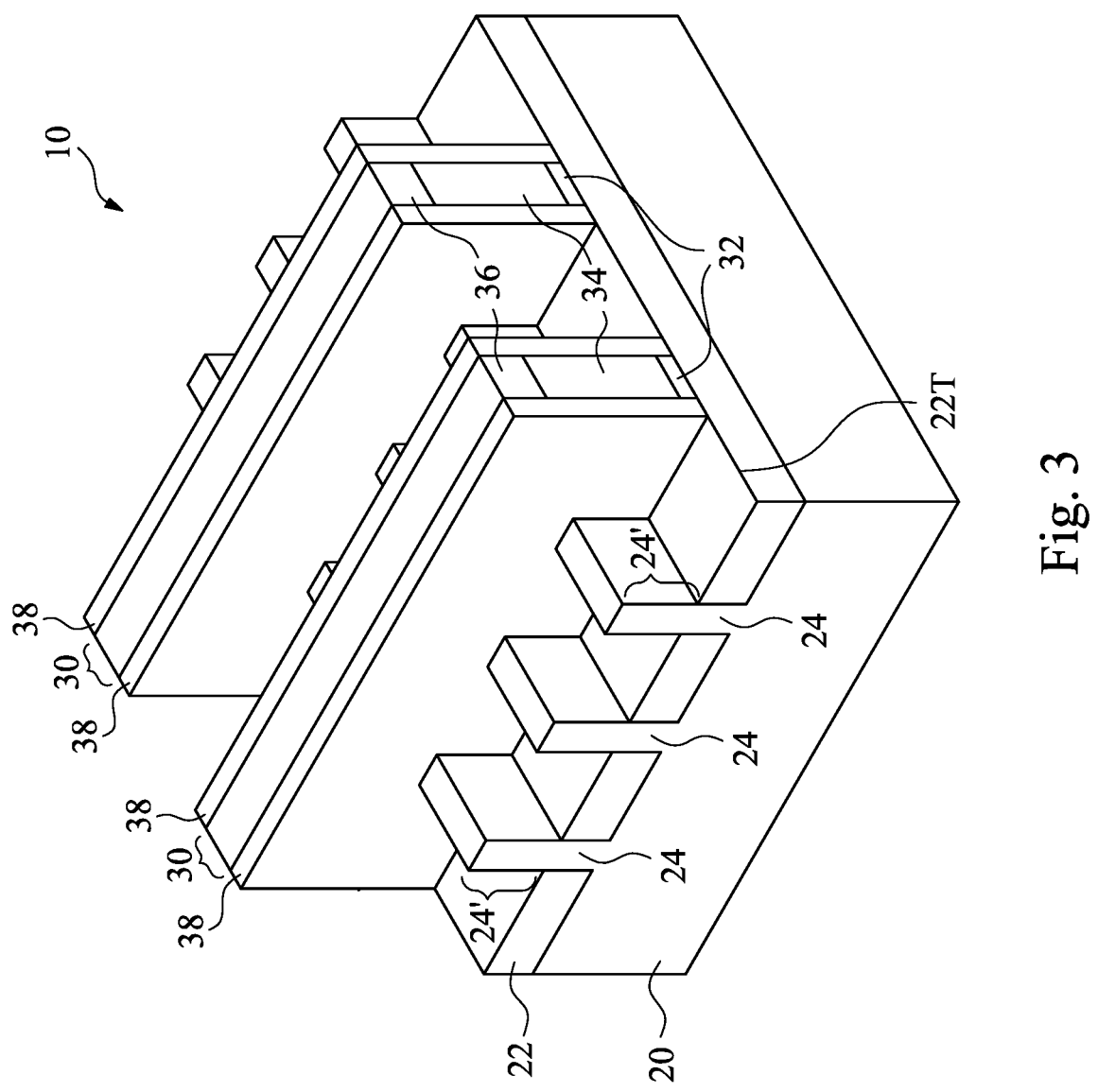

Referring to FIG. 3, dummy gate stack 30 is formed to extend on the top surfaces and the sidewalls of (protruding) fins 24'. The respective process is illustrated as process 206 in the process flow 200 as shown in FIG. 19. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrodes 34. Hard mask layers 36 may be formed of silicon nitride, silicon oxide, silicon carbo-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. The respective process is also illustrated as process 206 in the process flow 200 as shown in FIG. 19. In accordance with some embodiments of the present disclosure, gate spacers 38 are formed of a dielectric material(s) such as silicon nitride, silicon carbo-nitride, or the like, and may have a single-layer structure or a multi-layer structure including a plurality of dielectric layers.

Figure 4:
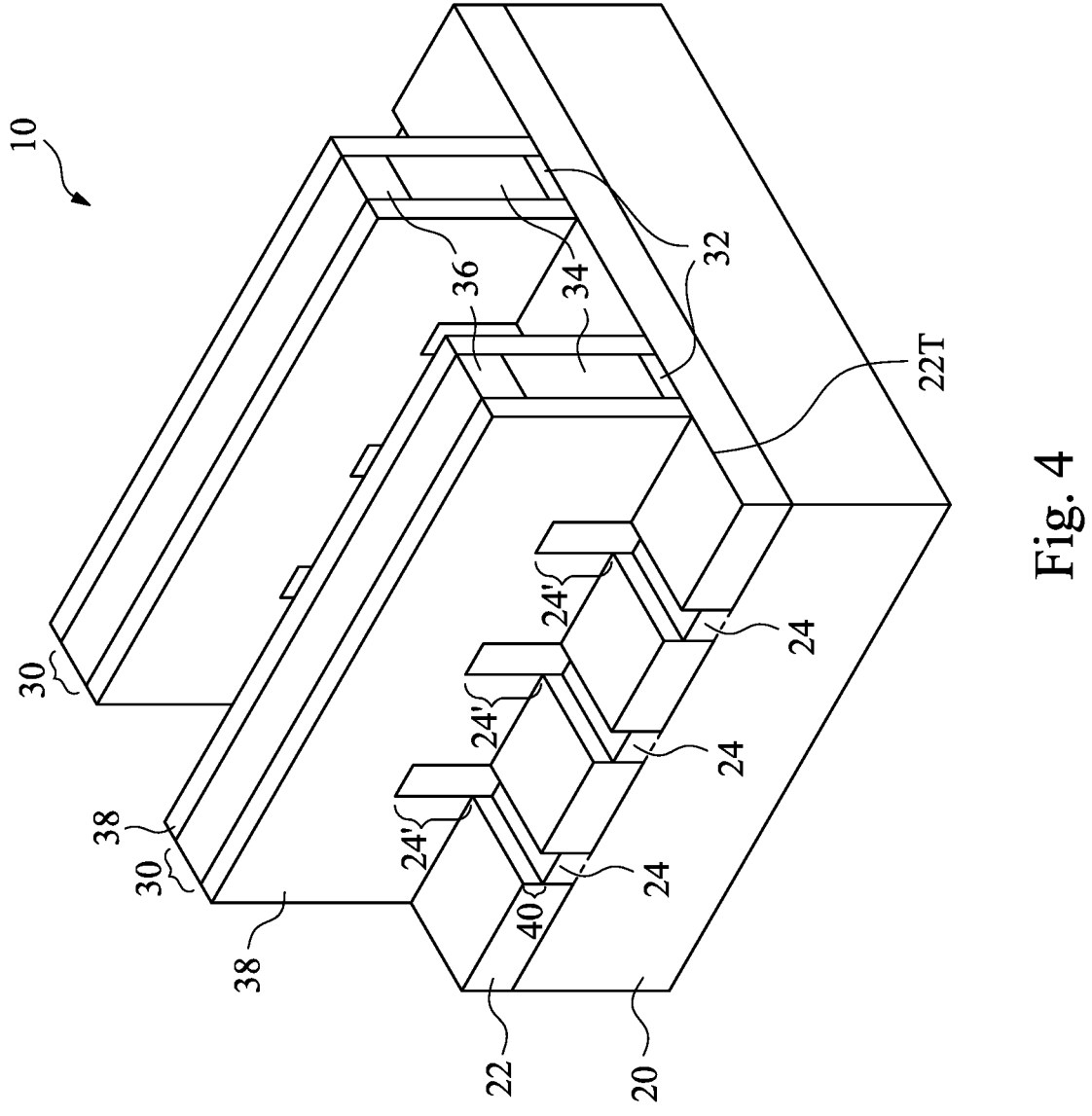

An etching process is then performed to etch the portions of protruding fins 24' that are not covered by dummy gate stack 30 and gate spacers 38, resulting in the structure shown in FIG. 4. The respective process is illustrated as process 208 in the process flow 200 as shown in FIG. 19. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22T of STI regions 22 in accordance with some embodiments. Recesses 40 are accordingly formed between STI regions 22. Recesses 40 are located on the opposite sides of dummy gate stacks 30, and include some portions lower than the top surfaces of STI regions 22, and some portions higher than the top surfaces of STI regions 22 and between neighboring gate stacks 30.

Figure 5A:
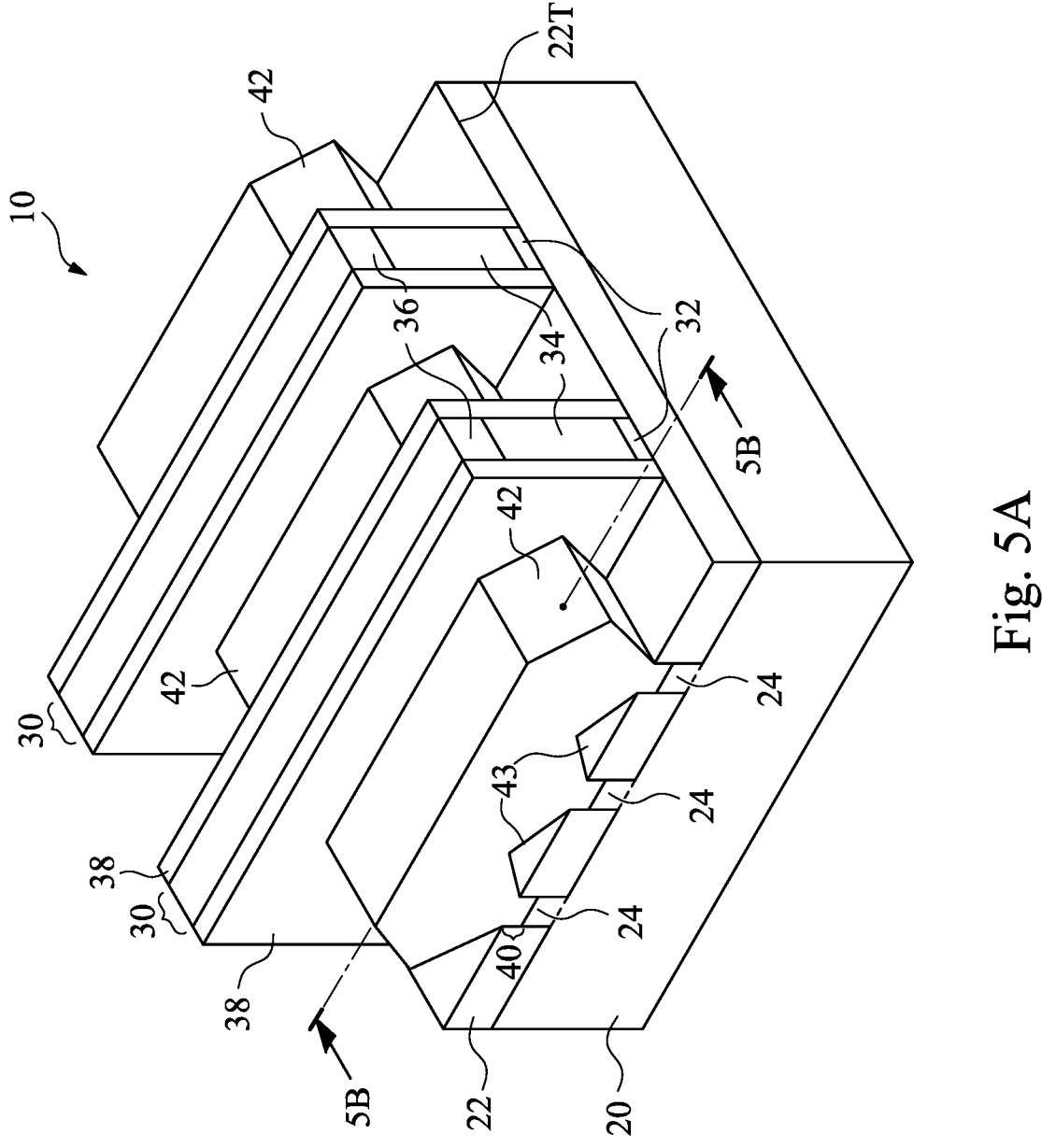

Next, an epitaxy process is performed to form epitaxy portions 42, which are selectively grown from recesses 40, resulting in the structure in FIG. 5A. The respective process is illustrated as process 210 in the process flow 200 as shown in FIG. 19. After epitaxy portions 42 fully fill recesses 40, epitaxy portions 42 start expanding horizontally, and facets may be formed. Epitaxy regions 42 are alternatively referred to as source/drain regions 42 since they act as the source/drain regions of the FinFETs.

Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 42 comprise III-V compound semiconductors such as GaAs, InP, GaN, InGaAs, InAlAs, GaSb, AlSb, AlAs, AlP, GaP, combinations thereof, or multi-layers thereof. It is appreciated that p-type epitaxy regions 42 and n-type epitaxy regions 42 may have different profiles. For example, the p-type epitaxy regions 42 may have clear facets, as shown in FIG. 5B, while the n-type epitaxy regions 42 may have rounded corners in the cross-sectional view.

Figure 5B:
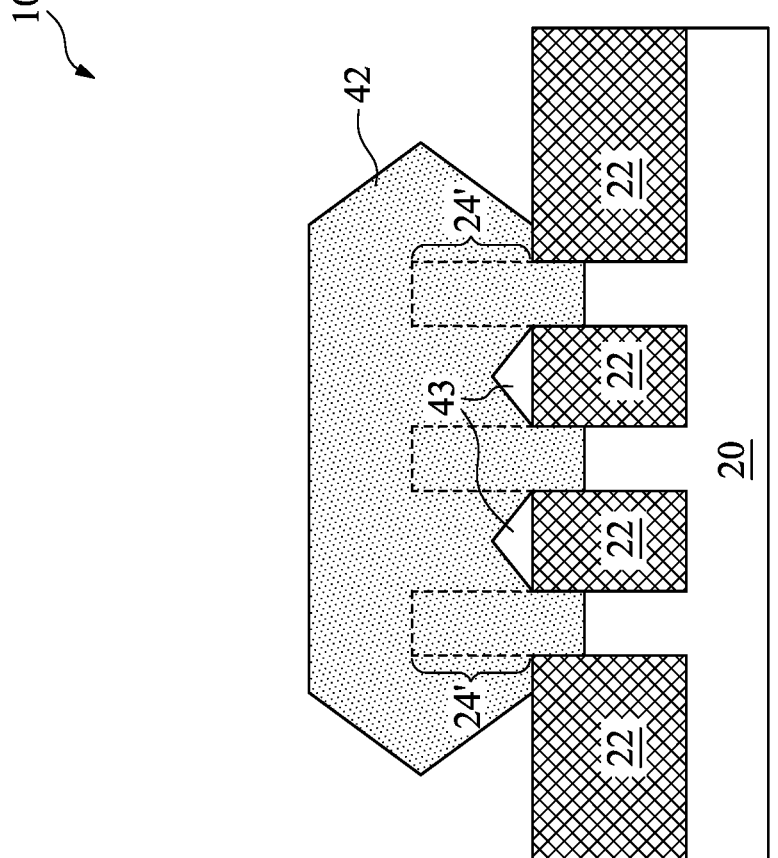

FIG. 5B illustrates a cross-sectional view of the structure shown in FIG. 5A, wherein the cross-sectional view is obtained from the vertical plane containing line 5B-5B in FIG. 5A. In FIG. 5B, the position of protruding fins 24', which is not in the illustrated plane, is shown using dashed lines to illustrate the relative positions of protruding fins 24' and epitaxy portions 42 in accordance with some embodiments.

With the proceeding of the epitaxy, the epitaxy regions 42 grown from neighboring recesses merge with each other to form an integrated epitaxy region 42. Voids (air gaps) 43 may be generated. In accordance with some embodiments of the present disclosure, the formation of epitaxy region 42 is finished when the top surface of epitaxy regions 42 is still wavy. In accordance with other embodiments of the present disclosure, the formation of epitaxy region 42 is finished when the top surface of epitaxy regions 42 has become planar.

Figure 6:
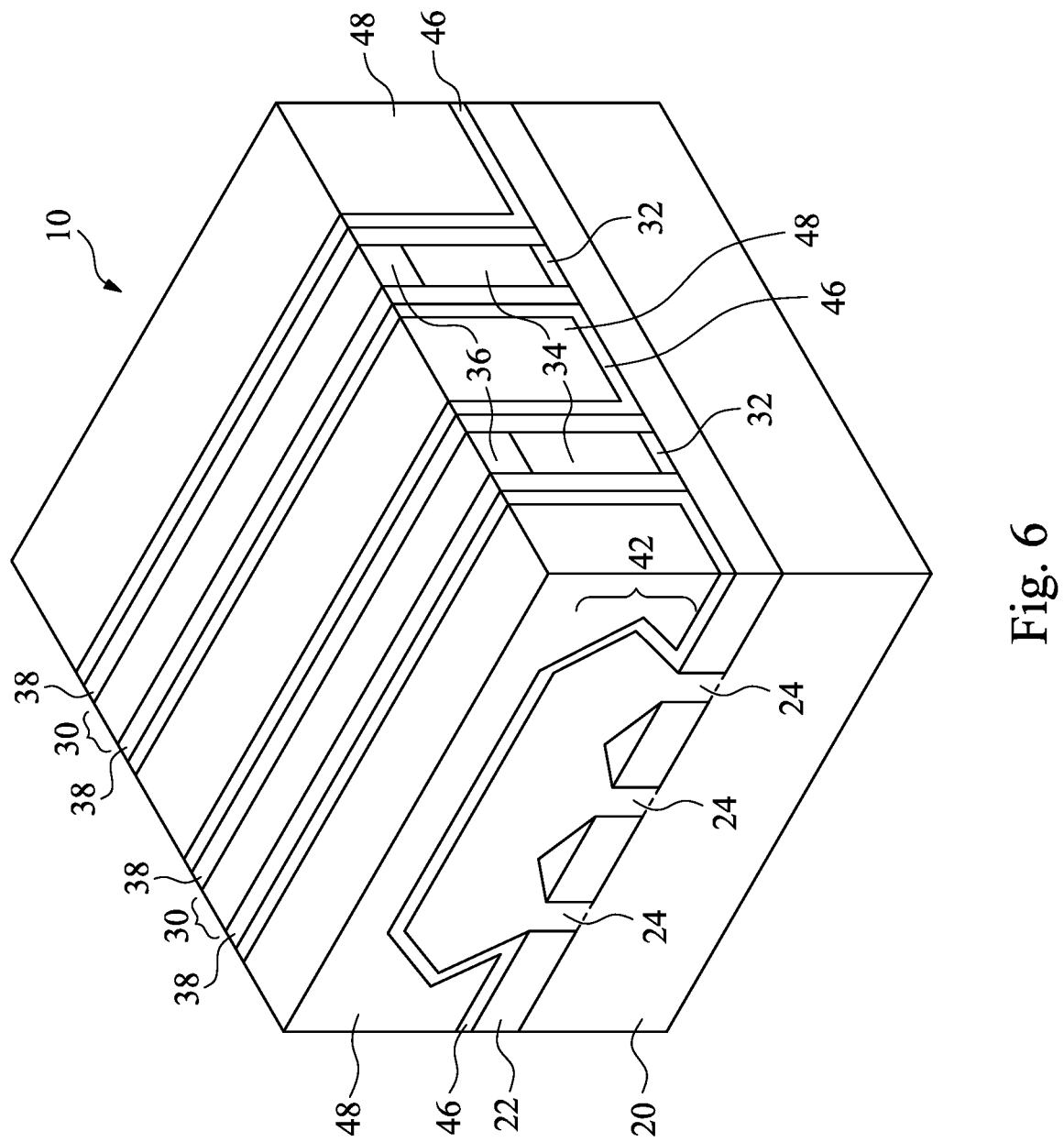

FIG. 6 illustrates a perspective view of the structure after the formation of Contact Etch Stop Layer (CESL) 46 and Inter-Layer Dielectric (ILD) 48. The respective process is illustrated as process 212 in the process flow 200 as shown in FIG. 19. CESL 46 may be formed of or comprise silicon oxide, silicon nitride, silicon carbo-nitride, or the like, and may be formed using CVD, ALD, or the like. ILD 48 may include a dielectric material formed using, for example, FCVD, spin-on coating, CVD, or another deposition method. ILD 48 may be formed of or comprises an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48, dummy gate stacks 30, and gate spacers 38 with each other.

Figure 7:
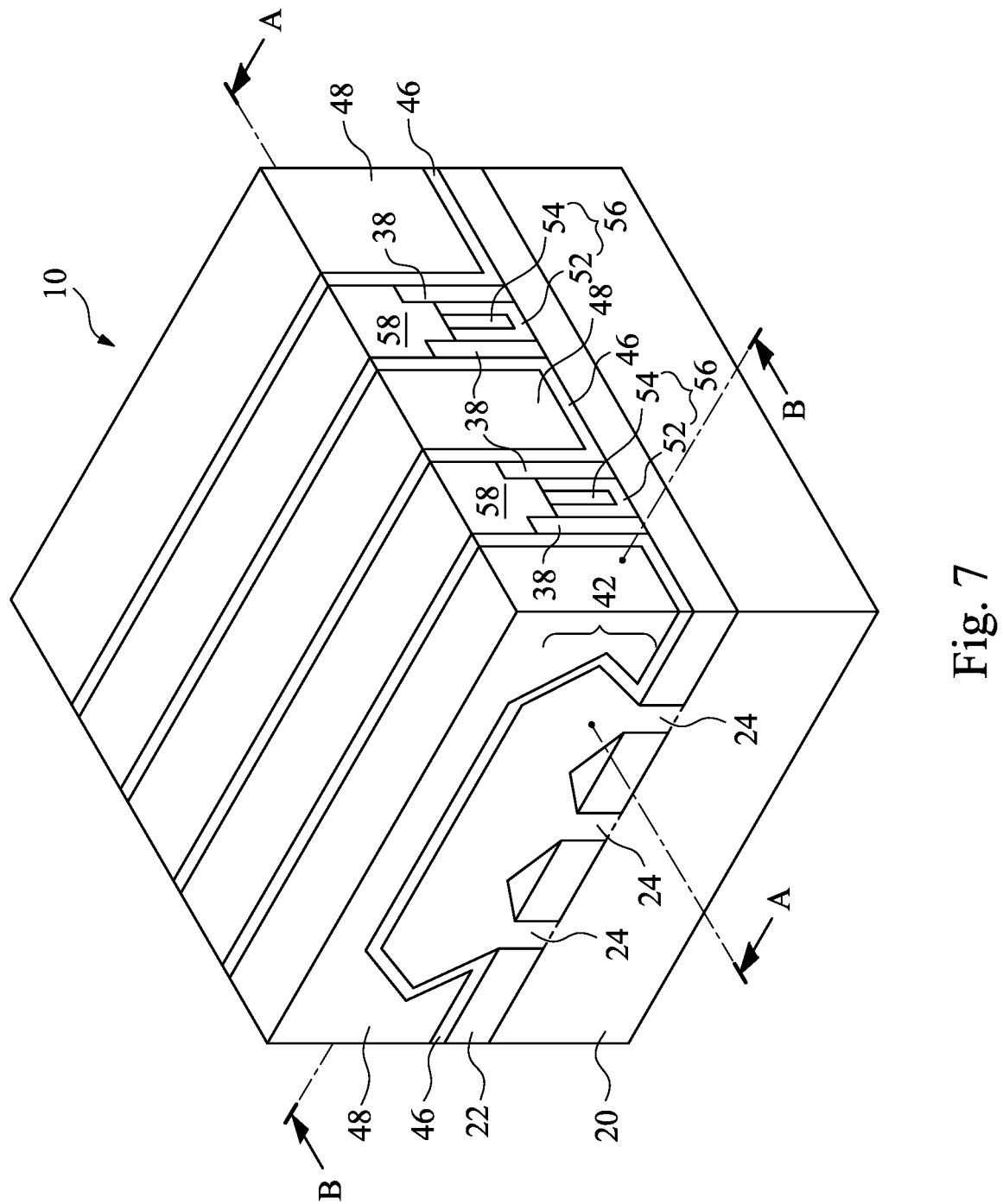

Next, dummy gate stacks 30 (including hard mask layers 36, dummy gate electrodes 34, and dummy gate dielectrics 32) are replaced with replacement gate stacks 56, which include gate electrodes 54 and gate dielectrics 52 as shown in FIG. 7. The respective process is illustrated as process 214 in the process flow 200 as shown in FIG. 19. When forming replacement gate stacks 56, the dummy gate stacks 30 as shown in FIG. 6 are removed first in a plurality of etching processes, resulting in trenches/openings to be formed between neighboring portions of ILD 48. The top surfaces and the sidewalls of protruding semiconductor fins 24' are exposed to the resulting trenches. In accordance with some embodiments, in the recessing, gate spacers 38 are also recessed. In accordance with alternative embodiments, gate spacers 38 are not recessed.

In accordance with some embodiments of the present disclosure, each of gate dielectric layers 52 include an Interfacial Layer (IL) as its lower part, which contacts the exposed surfaces of the corresponding protruding fins 24'. The IL may include an oxide layer such as a silicon oxide layer, which is formed through the thermal oxidation of protruding fins 24', a chemical oxidation process, or a deposition process. Gate dielectric layer 52 may also include a high-k dielectric layer over the IL. The high-k dielectric layer may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 24' and the sidewalls of gate spacers 38. In accordance with some embodiments of the present disclosure, the high-k dielectric layer is formed using ALD or CVD.

Referring further to FIG. 7, gate electrodes 54 are formed over gate dielectrics 52, Gate electrodes 54 include conductive sub-layers. The sub-layers are not shown separately, while the sub-layers are distinguishable from each other. The deposition of the sub-layers may be performed using conformal deposition processes such as ALD or CVD.

The stacked conductive layers may include a diffusion barrier layer and one (or more) work-function layer(s) over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to the conductivity type of the respective FinFET. For example, when the FinFET is a p-type FinFET, the work-function layer may include a TaN layer, a TiN layer over the TaN layer, and a TiAl layer over the TiN layer. When the FinFET is an n-type FinFET, the work-function layer may include an aluminum-containing material such as TiAl, TiAlC, TiAlN, or the like. After the deposition of the work-function layer (s), a barrier/capping layer, which may be another TiN layer, is formed.

The deposited gate dielectric layers and conductive layers for forming replacement gate stacks are formed as conformal layers extending into the trenches, and include some portions over ILD 48. Next, a metallic material is deposited to fill the remaining trenches between gate spacers 38. The metallic material may be formed of or comprises tungsten or cobalt, for example. Subsequently, a planarization process such as a CMP process or a mechanical grinding process is performed, so that the excess portions of the gate dielectric layers, conductive sub-layers, and the metallic material over ILD 48 are removed. As a result, metal gate electrodes 54 and gate dielectrics 52 are formed. Gate electrodes 54 and gate dielectrics 52 are in combination referred to as replacement gate stacks 56. The top surfaces of replacement gate stacks 56, gate spacers 38, CESL 46, and ILD 48 may be substantially coplanar at this time.

FIG. 7 also illustrates the formation of (self-aligned) hard masks 58 in accordance with some embodiments. The respective process is illustrated as process 216 in the process flow 200 as shown in FIG. 19. The formation of hard mask 58 may include performing an etching process to recess gate stacks 56. Gate spacers 38 may also (or may not) be recessed, with a smaller recessing depth (if recessed) than gate stacks 56. Recesses are thus formed between opposing vertical portions of CESL 46. The recesses are then filled with a dielectric material, followed by a planarization process such as a CMP process or a mechanical grinding process to remove excess portions of the dielectric material. The remaining portions of the dielectric material form hard masks 58, which is sometimes referred to as Self-Aligned Contact (SAC) mask. Hard masks 58 may be formed of or comprise silicon nitride, silicon oxynitride, silicon oxycarbo-nitride, or the like. Depending on whether gate spacers 38 are recessed or not, hard masks 58 may have top surfaces level with the top surfaces of gate spacers 38 and ILD 48, or may have a portion overlapping gate spacers 38, as shown in FIG. 7.

Figure 8A:
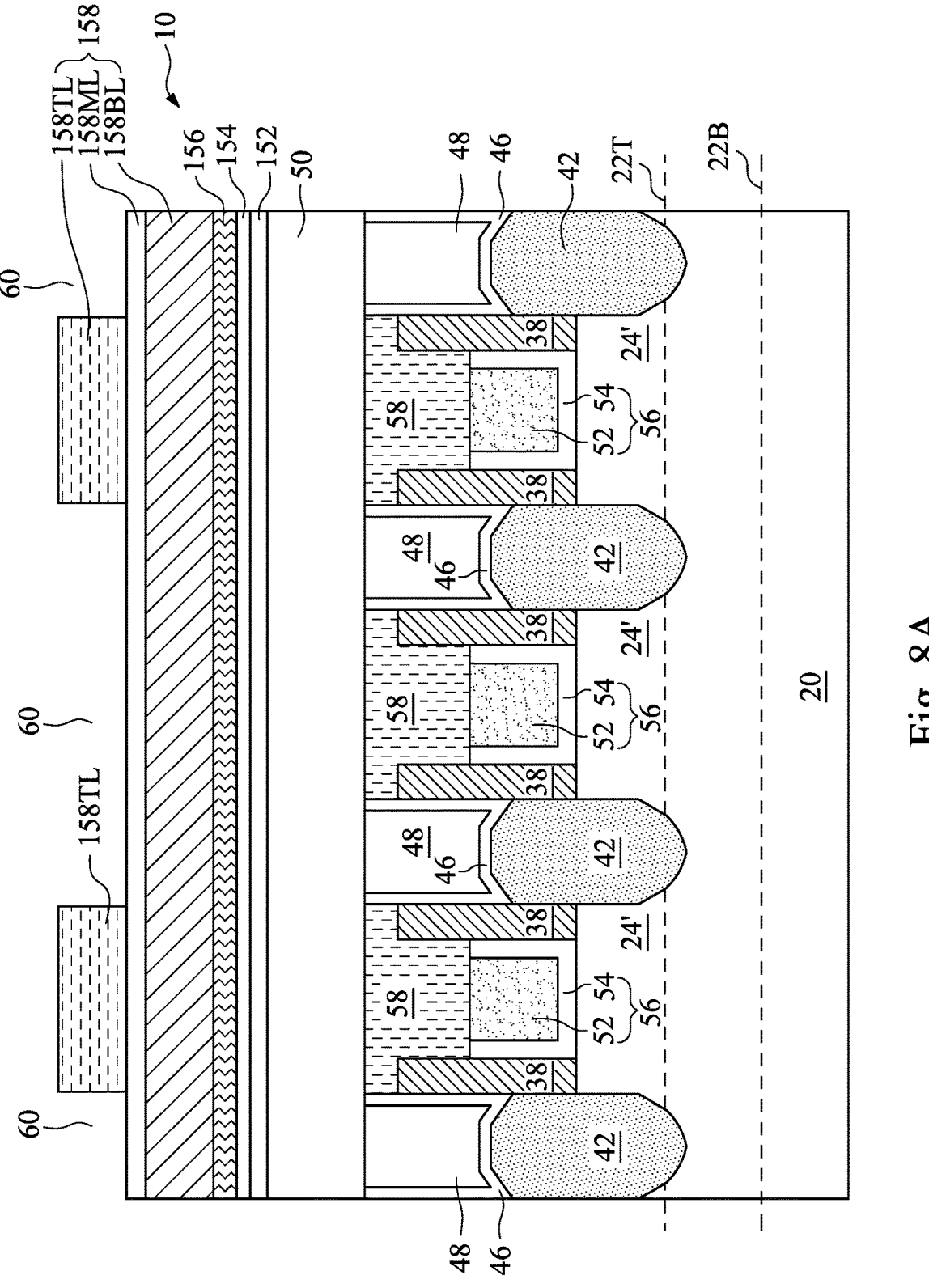
Figure 8B:
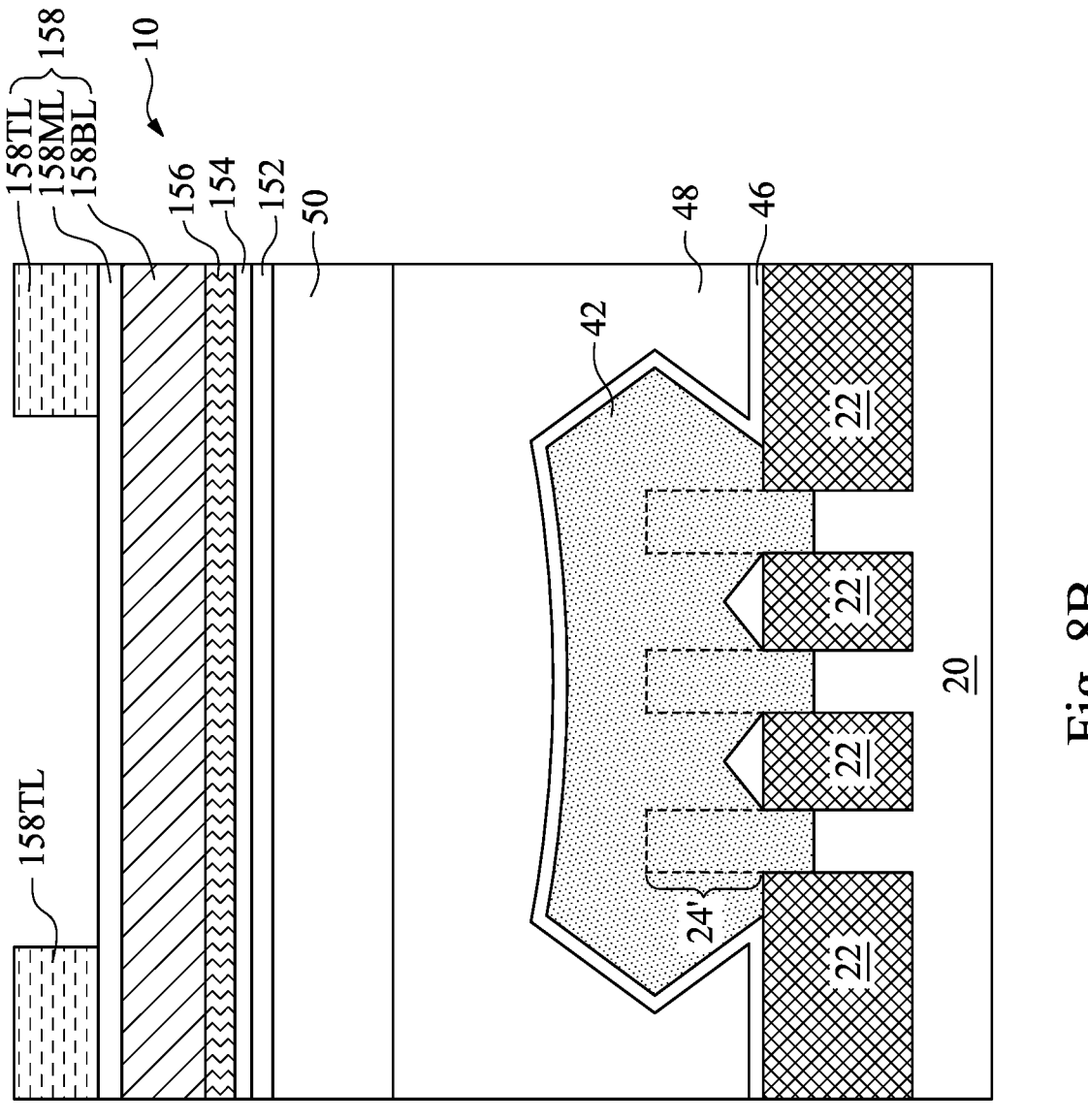

FIGS. 8A and 8B illustrate the cross-sectional views of the structure after the formation of a plurality of layers. First, dielectric layer 50 is deposited on the top surface of dielectric layer 48. The respective process is illustrated as process 218 in the process flow 200 as shown in FIG. 19. In FIGS. 8A and 8B and the subsequent figures, the figures with a reference notation having postfix "A" indicate these figures show the cross-section same as the cross-section A-A in FIG. 7, and the figures with a reference notation having postfix "B" may indicate that these figures show the cross-section same as the cross-section B-B in FIG. 7. Dielectric layer 50 may be formed of a material selected from the same candidate material for forming ILD 48, and the materials of dielectric layer 50 and ILD 48 may be the same or different from each other.

One or a plurality of hard masks are then formed. The respective process is illustrated as process 220 in the process flow 200 as shown in FIG. 19. In accordance with some embodiments, the hard masks include a metal-containing hard mask 152 (formed of tungsten doped carbide (WDC), for example), hard mask 154 (formed of silicon oxide, for example), and another hard mask 156, which has a high etching selectivity value relative to hard mask 154. In accordance with some embodiments, hard mask 156 is formed of or comprises silicon.

An etching mask 158, which may be a tri-layer, is then formed. Etching mask 158 may include bottom layer 158BL (also sometimes referred to as an under layer), middle layer 158ML over bottom layer 158BL, and top layer 158TL (also sometimes referred to as an upper layer) over middle layer 158ML. Top layer 158TL has openings 60 therein, which overlap epitaxy regions 42. In accordance with some embodiments, bottom layer 158BL is formed of a carbon-containing material (through CVD) or a cross-linked photo resist, and top layer 158TL is formed of a photo resist (through spin coating). Middle layer 158ML may be formed of an inorganic silicon-containing material, which may be a nitride (such as silicon nitride), an oxynitride (such as silicon oxynitride), an oxide (such as silicon oxide), or the like. Middle layer 158ML may be deposited through CVD.

Figure 9A:
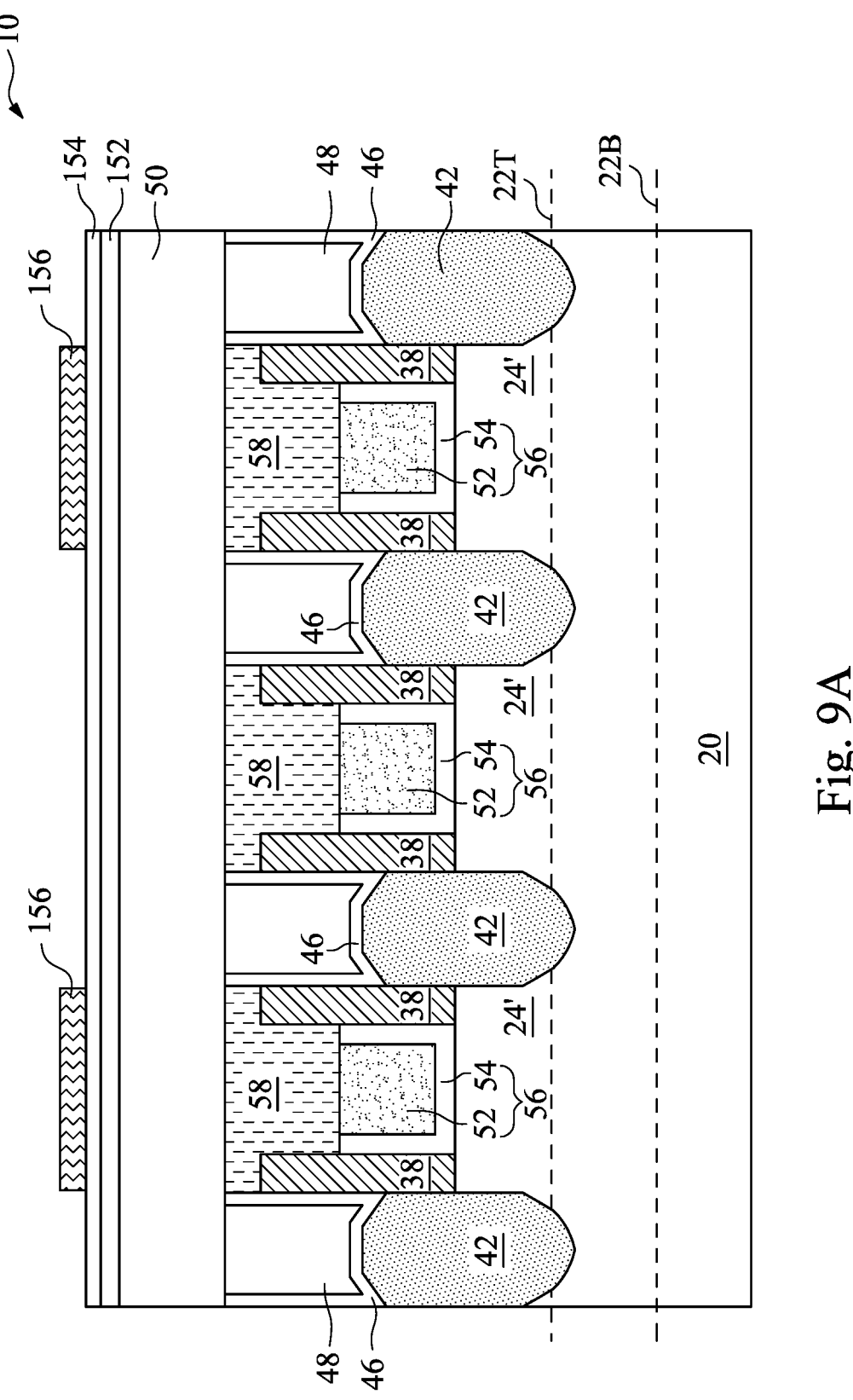
Figure 9B:
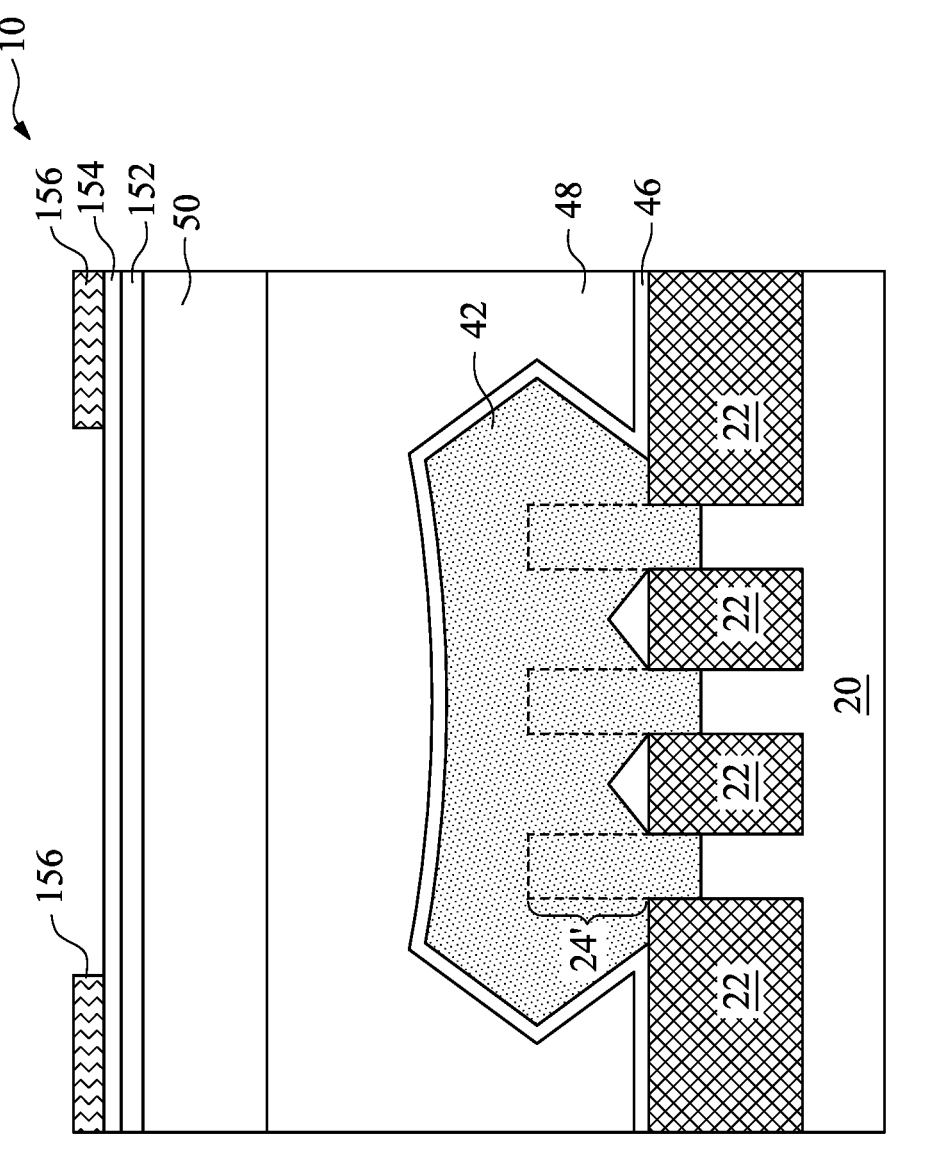

Next, etching processes are performed to extend openings 60 into hard mask 156. The respective process is illustrated as process 222 in the process flow 200 as shown in FIG. 19. The etching processes may be stopped on the top surface of hard mask 154. After the etching processes, the remaining portions of etching mask 158 may be removed. The resulting structure is shown in FIGS. 9A and 9B, in which hard mask 156 is exposed.

Figure 10A:
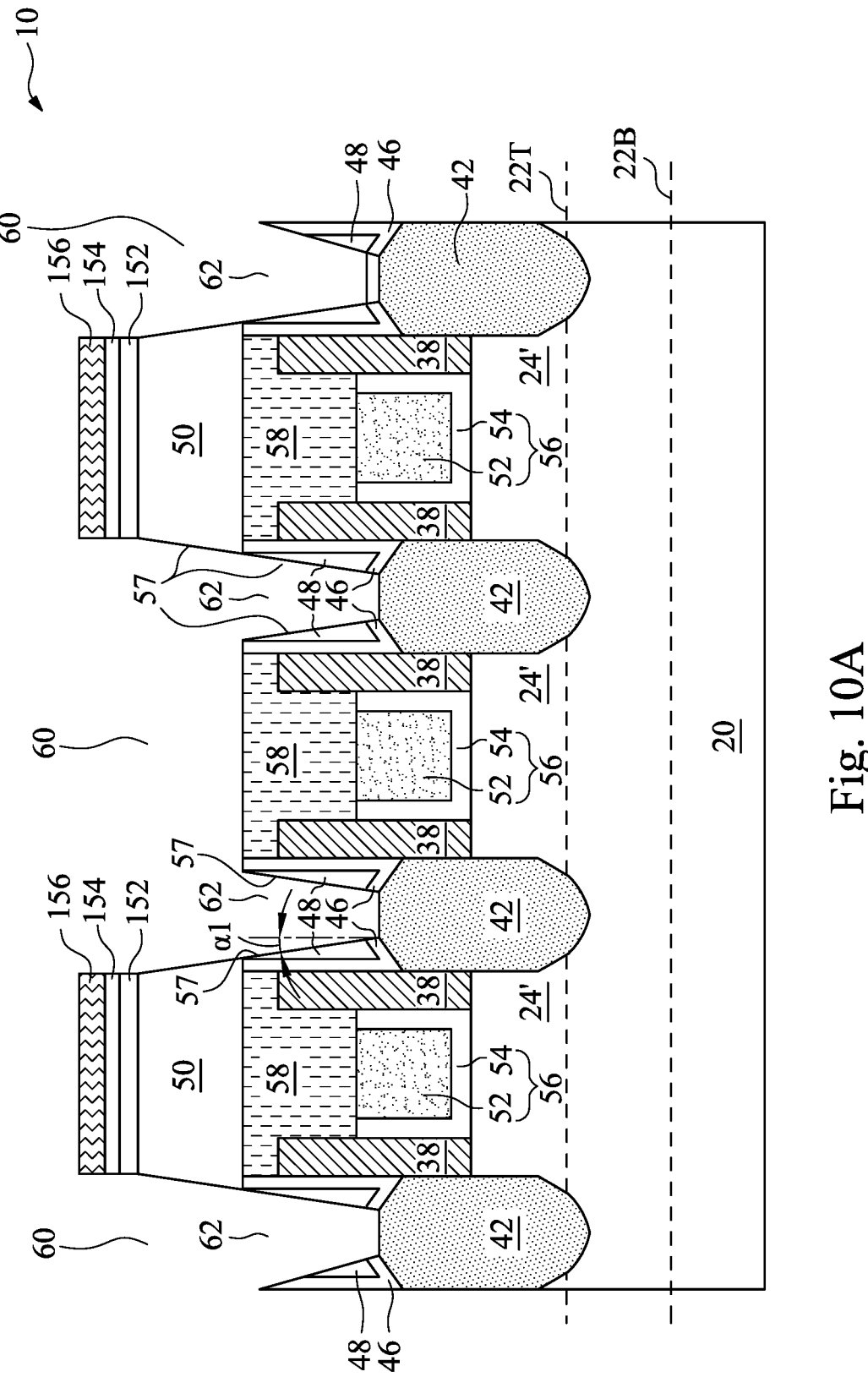
Figure 10B:
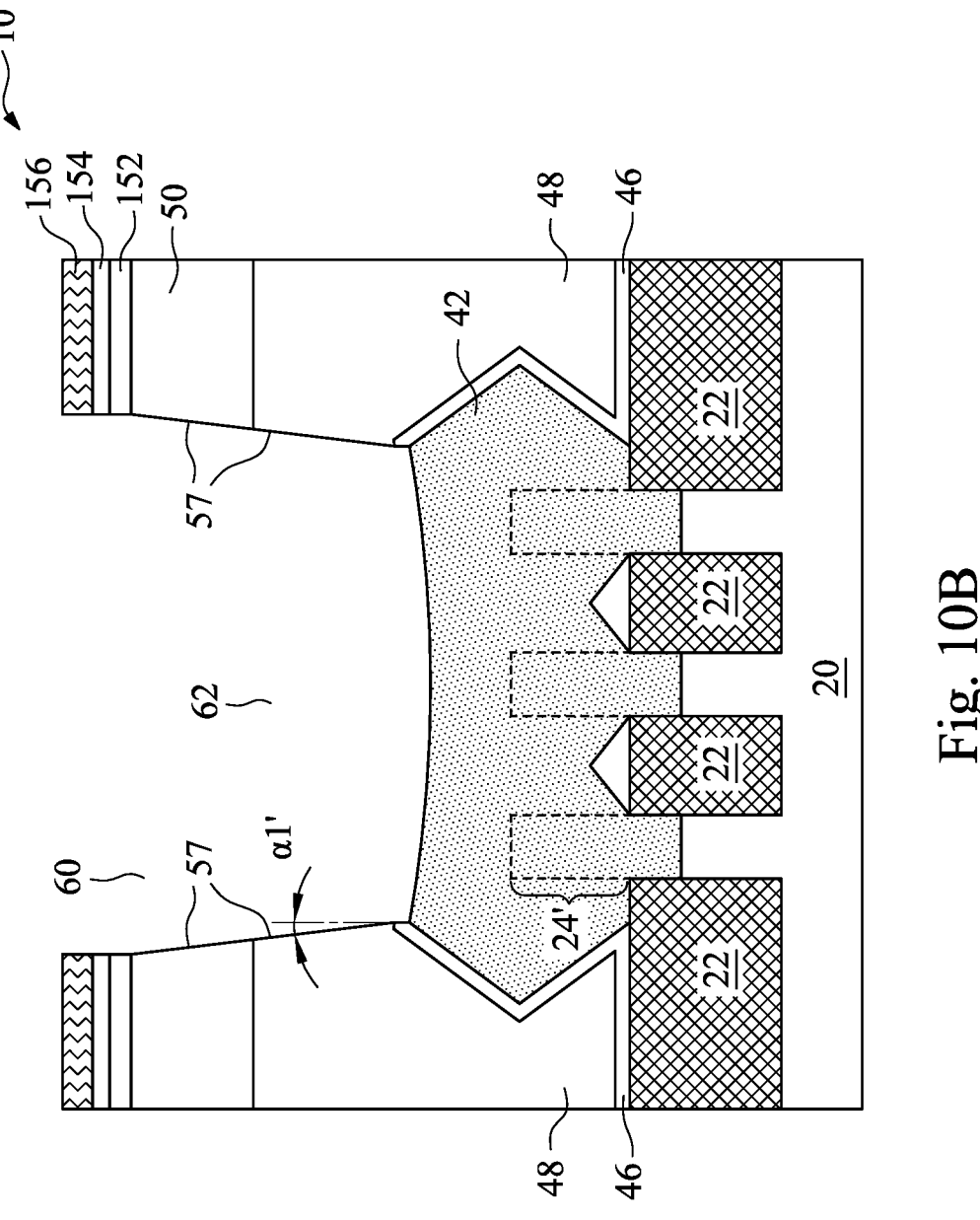

In a subsequent process, as shown in FIGS. 10A and 10B, hard mask 156 is used to etch the underlying hard masks 154 and 152, followed by the etching of dielectric layer 50 to extend openings 60 downwardly. ILD 48 is also etched. The respective process is illustrated as process 224 in the process flow 200 as shown in FIG. 19. The openings formed in ILD 48 are referred to as source/drain contact openings 62 hereinafter. In the embodiments in which the top surfaces of hard masks 58 are level with the top surfaces of gate spacers 38, gate spacers 38, when exposed, may stop the etching. In accordance with some embodiments, the etching is performed anisotropically, and may be performed through a dry etching process.

In accordance with some embodiments, the slant angles α1 of the straight portions of sidewalls 57 in FIG. 10A and α1' in FIG. 10B are smaller than about 15 degrees, and may be in the range between about 5 degrees and about 15 degrees. Sidewalls 57 may also be straight and vertical, with slant angles α1 and α1' being smaller than about 5 degrees, and may be in the range between about 1 degree and about 5 degrees. The etching gases may include the mixture of $NF_3$ and $NH_3$, the mixture of HF and $NH_3$, or the like. CESL 46 is then etched to reveal epitaxy regions 42. After the etching process, the remaining portions of hard masks 152, 154, and 156 are removed.

Figure 10C:
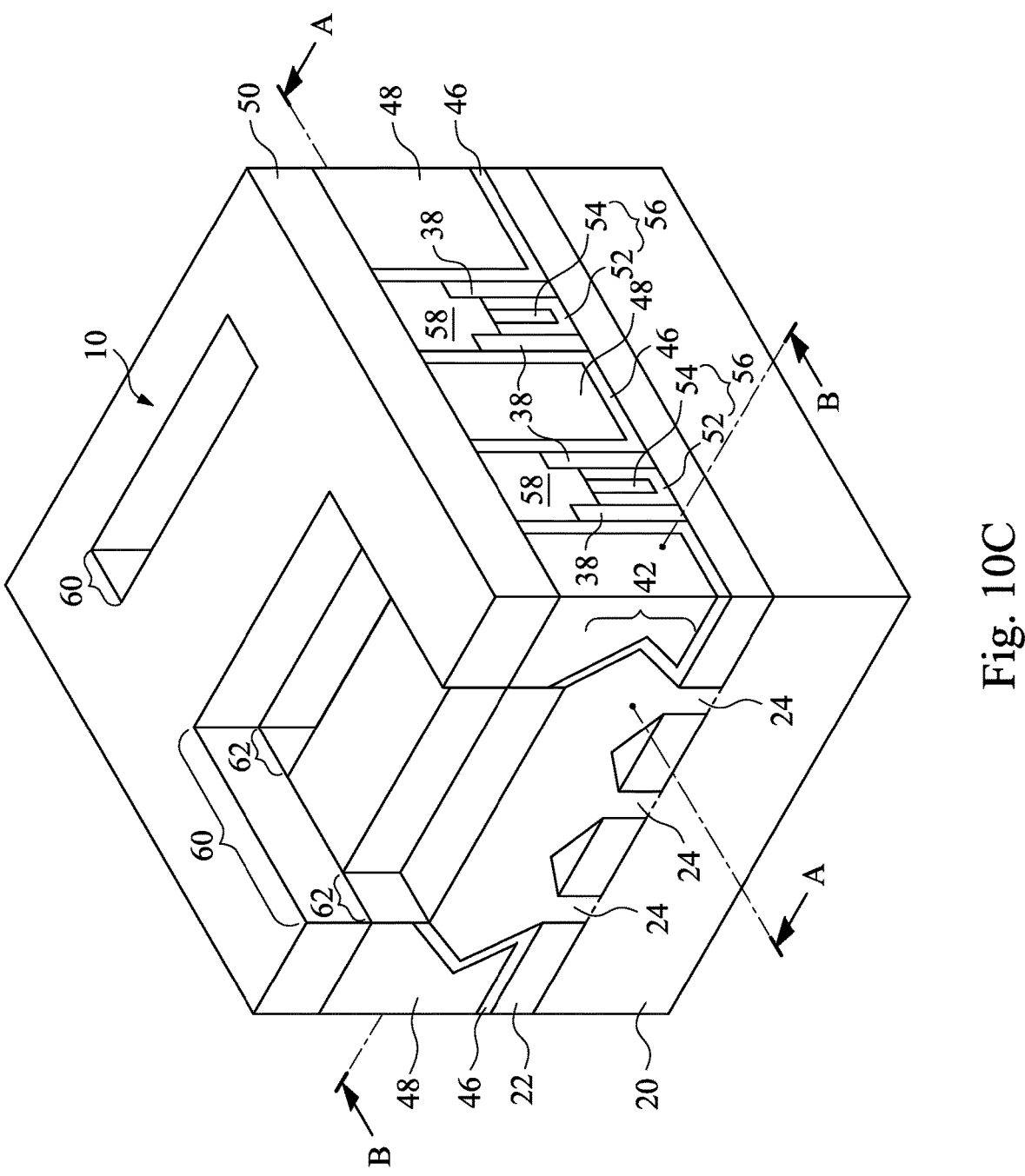

FIG. 10C illustrates a perspective view of the structure shown in FIGS. 10A and 10B, with hard masks 152, 154, and 156 not shown. The cross-sectional view shown in FIG. 10A is obtained from the cross-section A-A in FIG. 10C, and the cross-sectional view shown in FIG. 10B is obtained from the cross-section B-B in FIG. 10C.

Figure 11A:
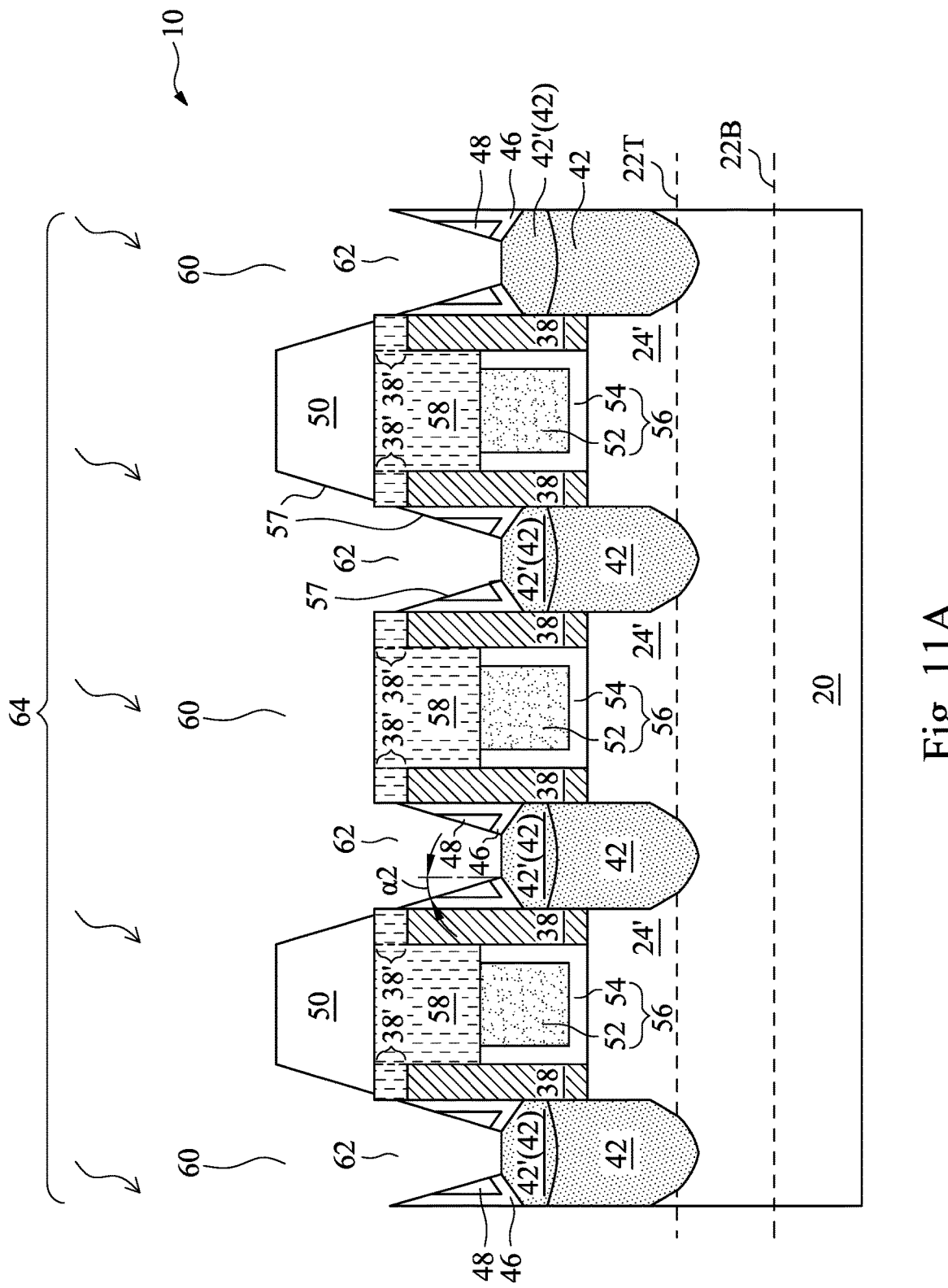
Figure 11B:
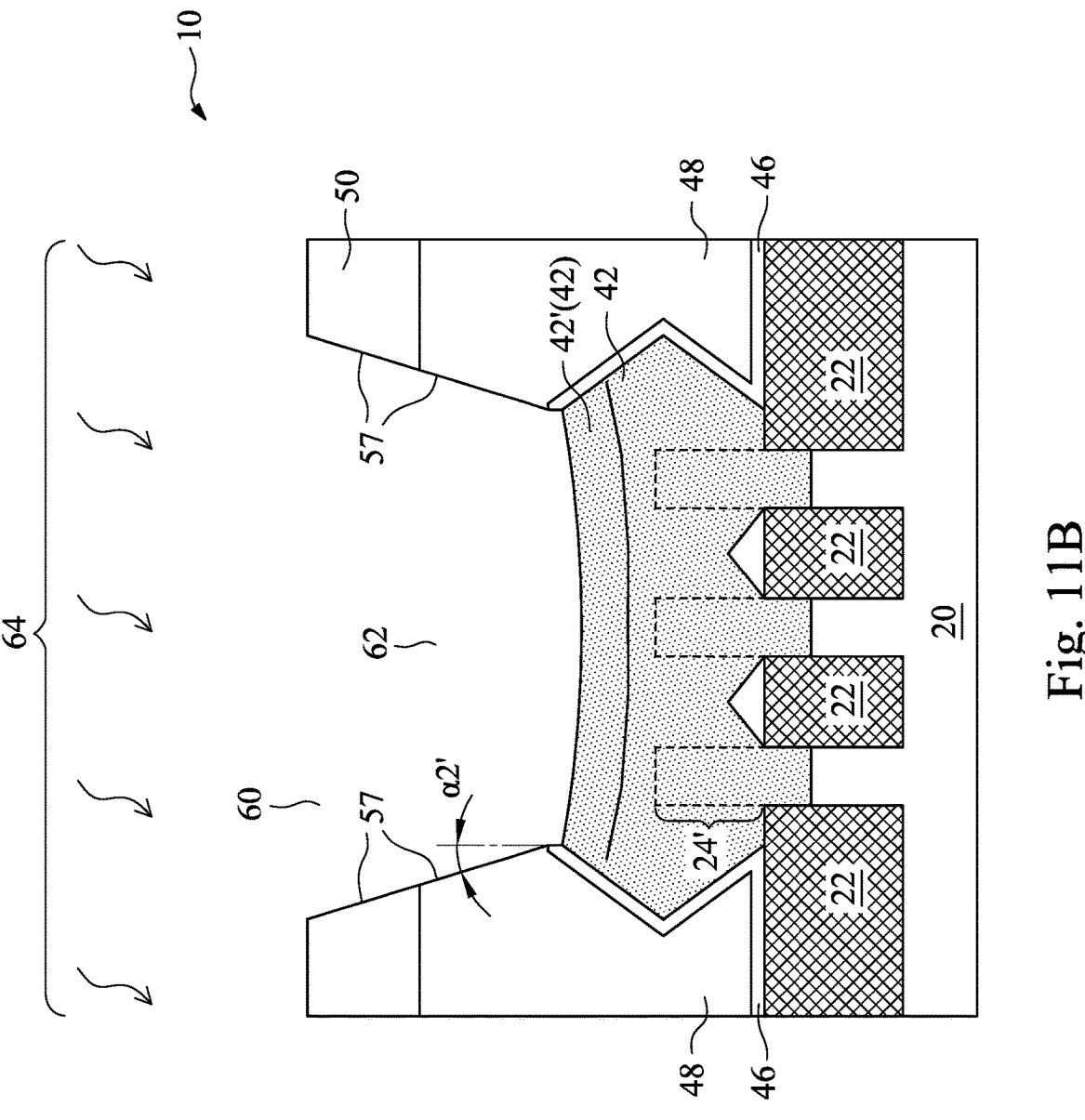

When epitaxy regions 42 are for forming p-type FinFETs, a p-type impurity (dopant) implantation may be performed. For example, boron, gallium, and/or indium may be implanted. As a result, the top portions of epitaxy regions 42 are heavily doped to form heavily-doped regions 42', as shown in FIGS. 11A and 11B. The n-type epitaxy regions may be masked in the p-type implantation. In accordance with alternative embodiments, the p-type impurity (dopant) implantation process is skipped.

FIGS. 11A and 11B illustrate a pull-back process 64 for modifying the profiles of openings 60 and source/drain contact openings 62. The respective process is illustrated as process 226 in the process flow 200 as shown in FIG. 19. The pull-back process makes it easier for the subsequent formation of features in openings 60 and source/drain contact openings 62. The pull-back process is performed through an etching process, wherein dry etching or wet etching process may be performed. In accordance with some embodiments, the etching includes isotropic etching, wherein the etching gas is selected to attack dielectric layer 50, ILD 48, and may or may not attack CESL 46. For example, the etching gas may include $C_xF_yH_z$, $O_2$, $CO_2$, Ar, $NF_3$, $NH_3$, HF, $H_2$, and/or the like. The etching may also include some anisotropic effect in addition to the isotropic effect. For example, a bias power lower than about 300 watts may be applied.

The pull-back process 64 is controlled so that the upper portions of openings 60 and 62 are expanded more than the respective lower portion, so that the straight portions of sidewalls 57 of the openings 60 and 62 are more slanted than before the pull-back process (FIGS. 10A and 10B). For example, the slant angles α2 in FIG. 11A and α2' in FIG. 11B may be smaller than about 20 degrees, and may be in the range between about 5.5 degrees and about 20 degrees. Slant angles α2 and α2' may also be smaller than about 5.5 degrees, and may be in the range between about 1.5 degrees and about 5.5 degrees. Also, the slant angles α2 in FIG. 11A and α2' in FIG. 11B are greater than the respective slant angles α1 in FIG. 10A and α1' in FIG. 10B. In accordance with some embodiments, the difference (α2−α1) is greater than about 0.5 degrees, and may be in the range between about 0.5 degrees and about 5.0 degrees. The difference (α2'−α1') may also be greater than about 5.0 degrees, and may be in the range between about 5.0 degrees and about 10.0 degrees.

It is appreciated that slant angle α1 (FIG. 10A) may be equal to or smaller than slant angle α1' (FIG. 10B). On the other hand, due to the pull-back process, slant angle α2 (FIG. 11A) is smaller than slant angle α2' (FIG. 11B). The difference (α2'−α2) may be greater than about 1 degree, and may be in the range between about 1 degree and about 10 degrees.

In order to make the sidewalls 57 of openings 60 and 62 more slanted, the pull-back process 64 may be controlled, for example, to cause dielectric layer 50 and ILD 48 to have greater etching rates at their upper portions than the respective lower portions. For example, increasing the pressure of process gases may cause the lower portion to be etched less than the upper portions. In accordance with some embodiments, the pressure in the etching chamber may be in the range between about 0.001 Torr and about 1 Torr. Furthermore, reducing the temperature of wafer 10 may cause the lower portion to be etched less than the upper portions. In accordance with some embodiments, during pull-back process 64, the temperature of wafer 10 may be in the range between about 0° C. and about 150° C. It is appreciated that the pull-back effect is also related to other factors such as the lateral sizes and depths of the opening 60 and source/drain opening 62, and these factors may also affect the effective ranges of other factors such as pressure and temperature.

In the pull-back process 64, the hard masks 58 may be exposed, and hard masks 58 may stop the pull-back. Alternatively, the pull-back may be performed so that hard masks 58, if exposed, are etched at a smaller etching rate than dielectric layer 50 and ILD 48, so that hard masks 58 still has the function of protecting the underlying features, while the corners of hard masks 58 are rounded, and the sidewalls of openings 60 and 62 are smoother and straighter. In accordance with alternative embodiments in which gate spacers 38 are exposed, gate spacers 38 may function as the etch stop layer, and may or may not be etched. Similarly, gate spacers 38, if etched, are etched at a smaller etching rate than dielectric layer 50 and ILD 48. For example, dashed lines 38' (FIG. 11A) schematically illustrates the portions of gate spacers 38 that are exposed.

Figure 12A:
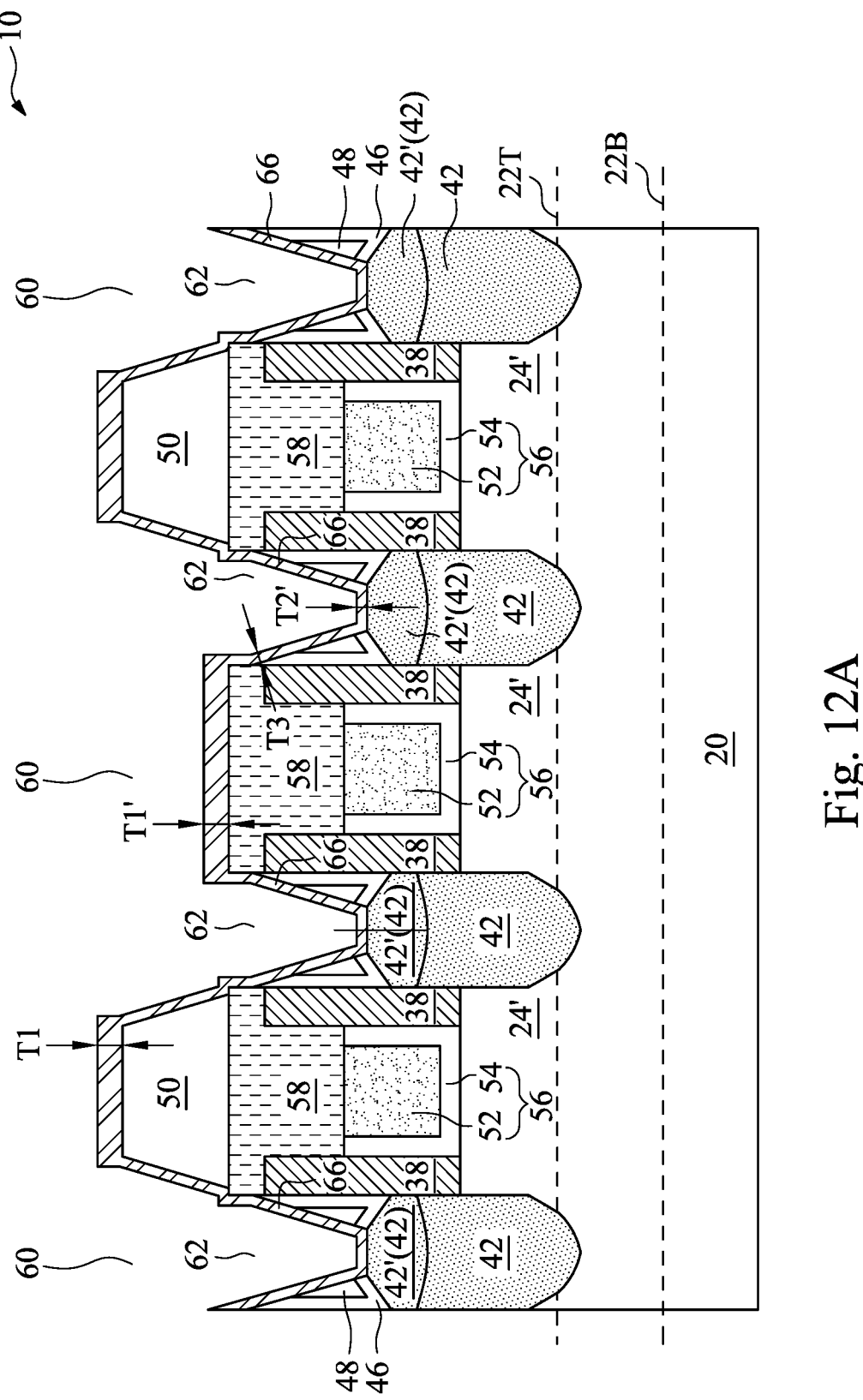
Figure 12B:
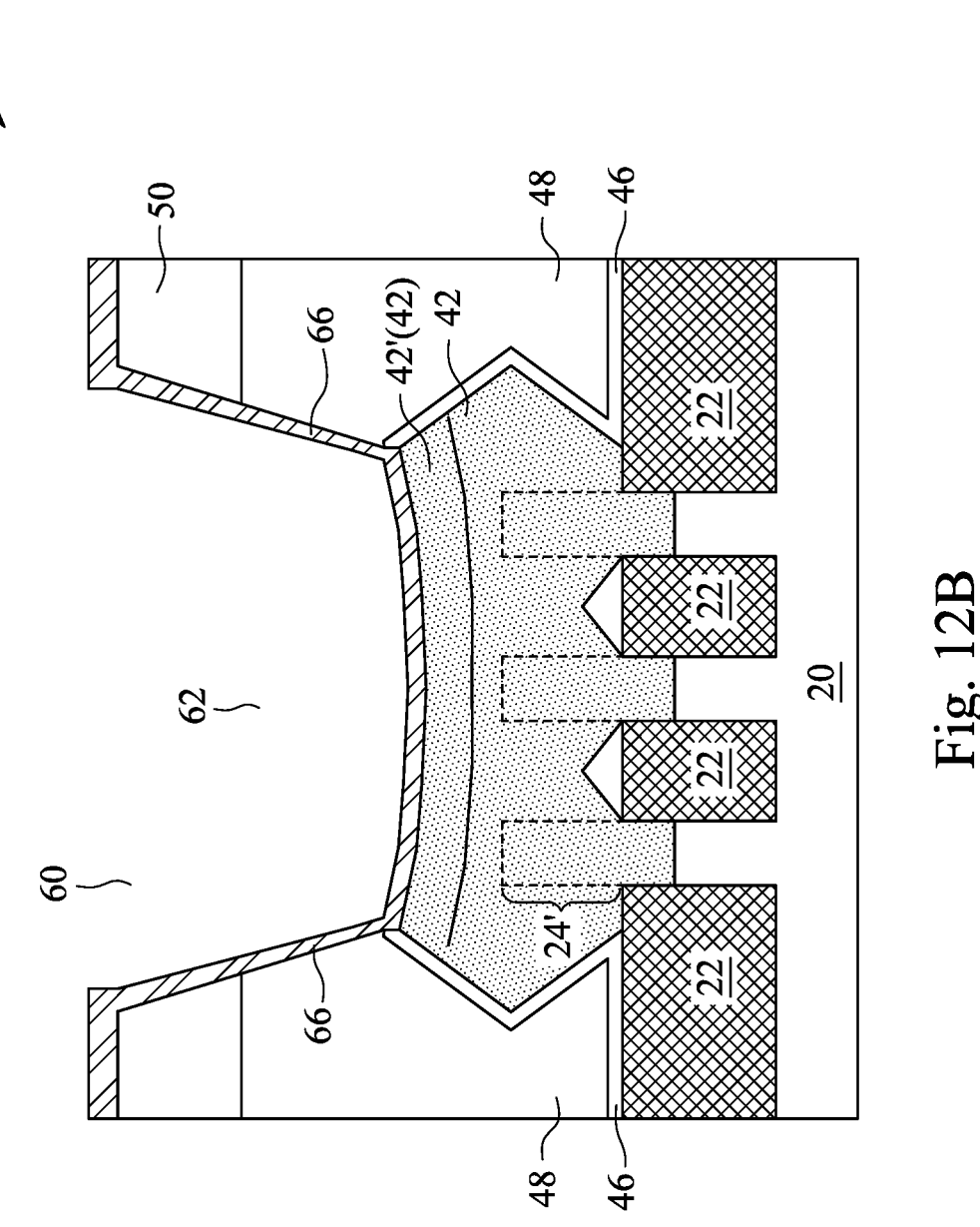

FIGS. 12A and 12B illustrate the deposition of isolation layer 66. The respective process is illustrated as process 228 in the process flow 200 as shown in FIG. 19. In accordance with some embodiments, isolation layer 66 may be formed of or comprises silicon nitride, silicon oxide, silicon oxycarbo-nitride, silicon oxycarbide, or the like, or a metal-containing dielectric layer such as aluminum oxide, aluminum nitride, hafnium oxide, or the like. The dielectric constant of isolation layer 66 may be lower than about 10, or lower than about 5.

The deposition is non-conformal, so that the thicknesses T2 of isolation layer 66 at the bottoms of openings 62 may be smaller than the thicknesses of the upper portions of isolation layer 66 in openings 62 and 60. Thickness T2 may also be smaller than top horizontal thicknesses T1 and T1'. For example, ratio T2/T1 may be smaller than about 2.5, and may be in the range between about 1 and about 2.5. Thickness T1 may be in the range between about 5 Å and about 30 Å. Furthermore, at least from the top portions to the bottom portions of openings 62, the thicknesses of isolation layer 66 may gradually reduce.

The deposition process may include ALD, Plasma Enhance Chemical Vapor Deposition (PECVD), CVD, or the like. It is appreciated that although ALD process is a conformal deposition process, when the aspect ratio of openings 62 and 60 are too high, it is difficult for the precursors to reach lower portions of the deep trenches, and hence the isolation layer 66 becomes thinner when going deeper into the high aspect ratio trenches. In accordance with some embodiments in which the aspect ratio of opening 62 and source/drain contact openings 60 are not great enough, other non-formal deposition methods such as PECVD may be used.

In accordance with some embodiments when ALD is used, the wafer temperature may be in the range between about 300° C. and about 450° C. The pressure may be in the range between about 0.1 Torr and about 100 Torr. The precursor may include $SiH_2I_2$, $SiH_2Cl_2$, $SiCl_4$, or the like, or combinations thereof. The precursor may also include $NH_3$, $N_2$, the mixture of $N_2$ and $H_2$, or the like, or combinations thereof. The power for generating plasma from $NH_3$ or the mixture of $N_2$ and $H_2$ may be in the range between about 500 watts and about 700 watts.

Figure 13A:
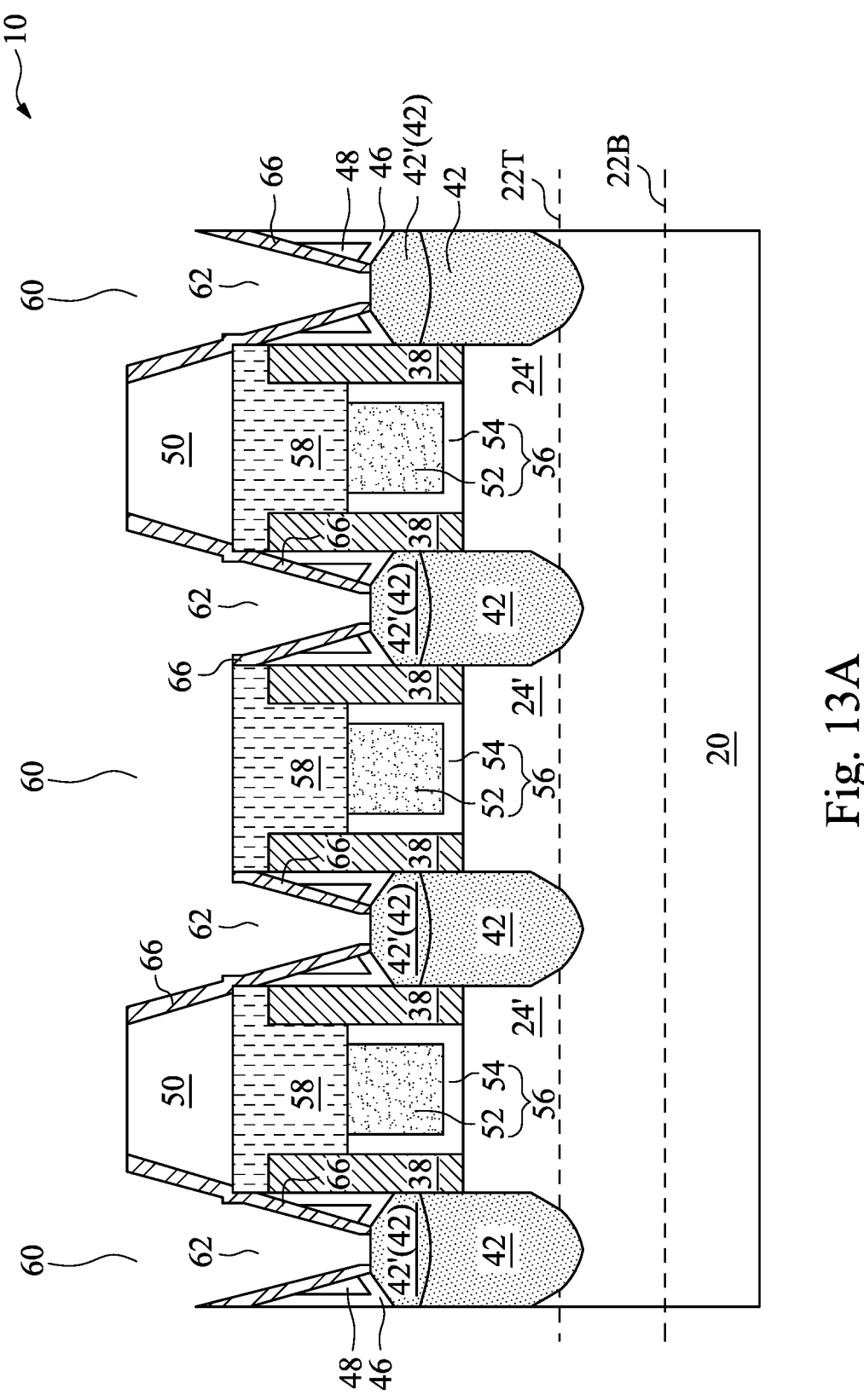
Figure 13B:
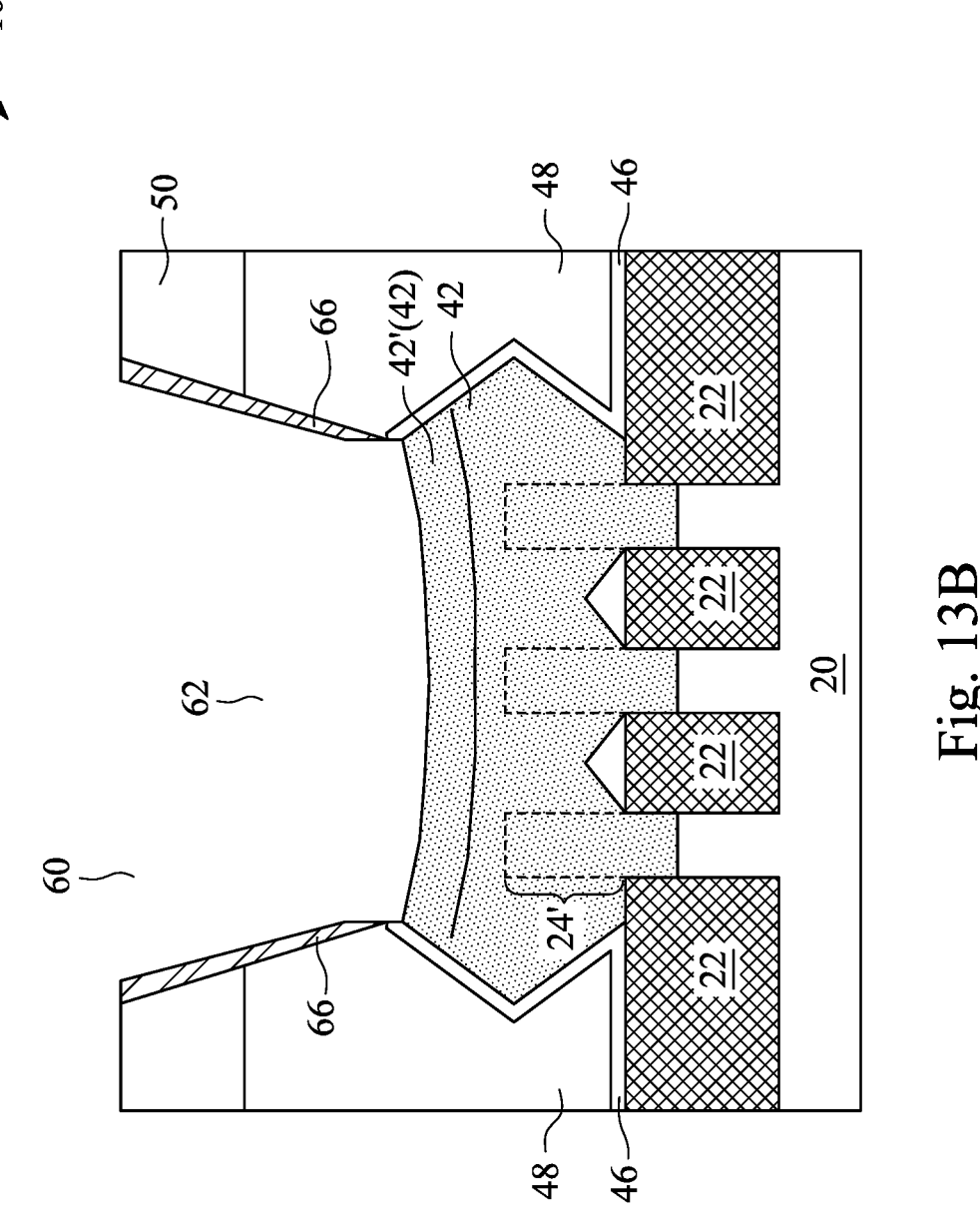

FIGS. 13A and 13B illustrate the etching of isolation layer 66, so that the horizontal portions of isolation layer 66 are removed. The respective process is illustrated as process 230 in the process flow 200 as shown in FIG. 19. At the bottoms of source/drain contact openings 62, isolation layer 66 is also removed to expose epitaxy regions 42, or thinned so that there are thin horizontal portions of isolation layer 66 on top of epitaxy regions 42. For example, the thin horizontal portions of isolation layer 66 may have a thickness smaller than about 3 Å (if they remain). The etching may be performed through an anisotropic etching process. It is appreciated that although isolation layer 66 is slanted since the sidewalls of dielectric layer 50 and ILD 48 are slanted, isolation layer 66, at a time after the etching, still have portions remaining on the sidewalls of dielectric layer 50 and ILD 48.

An implantation process may be performed for forming PAI regions 42' in epitaxy regions 42. In accordance with some embodiments, germanium is implanted. In accordance with other embodiments, other dopant such as silicon or an inert specie such as neon, argon, xenon, and radon is implanted. The implantation may be performed after the horizontal portions of isolation layer 66 are etched, as shown in FIGS. 13A and 13B, or may be performed after the deposition and before the etching of isolation layer 66.

A pre-cleaning process may be performed to remove any oxide layer formed on the top surfaces of epitaxy regions 42, and prepare epitaxy regions 42 for silicidation process. In the pre-cleaning process, the horizontal portions (if any) of isolation layer 66 on the top surfaces of epitaxy regions 42 are removed. The thickness of the isolation layer 66 on the sidewalls of the dielectric layer 50 and ILD 48 may be in the range between about 8 Å and about 10 Å.

Figure 14A:
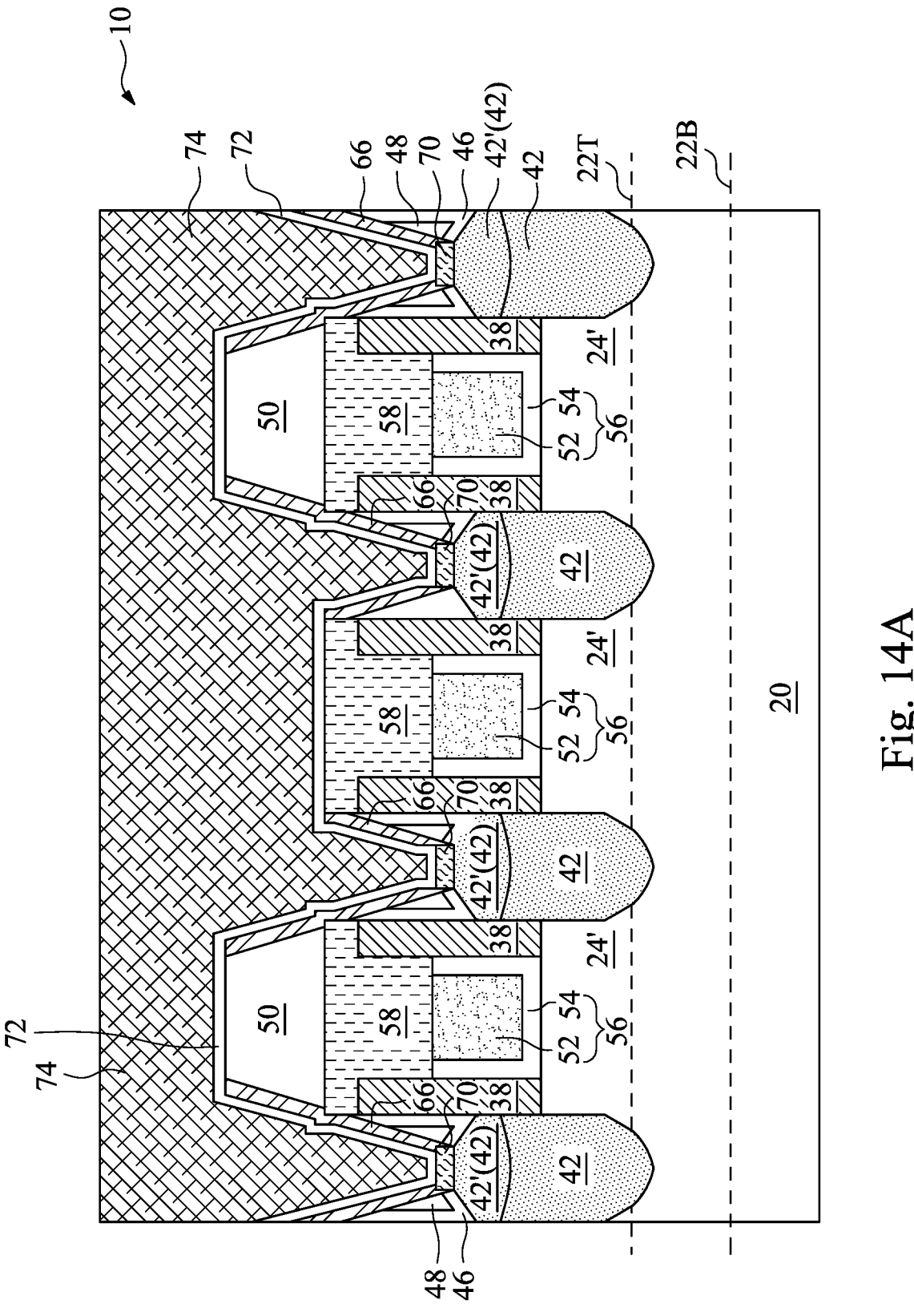
Figure 14B:
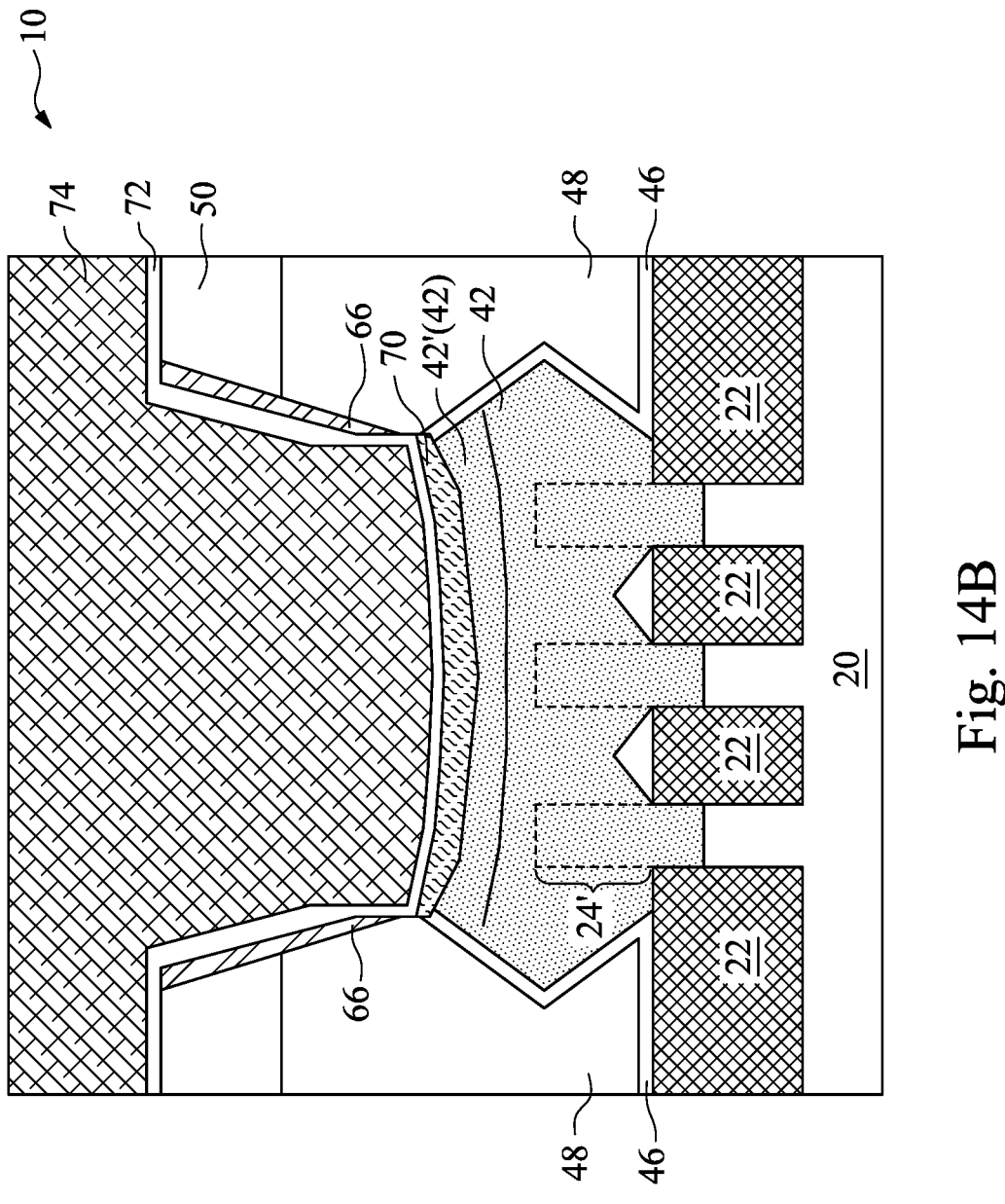

Next, as shown in FIGS. 14A and 14B, silicide regions 70 are formed on the top surfaces of epitaxy regions 42. The respective process is illustrated as process 232 in the process flow 200 as shown in FIG. 19. In accordance with some embodiments, to form silicide regions 70, a metal layer (not shown) and a metal nitride layer are deposited, for example, using conformal deposition processes. In accordance with some embodiments, the metal layer comprises titanium, cobalt, or the like. The metal nitride layer may be a titanium nitride layer, and may be formed using ALD, CVD, or the like. The metal nitride layer may also be formed by nitridating the top portion of the metal layer, and leaving the bottom portion of the metal layer not nitridated.

Next, an annealing process (which may be a rapid thermal anneal process) is performed to react the metal layer with the top portion of source/drain regions 42 to form silicide regions 70. The portions of the metal layer on the sidewalls of ILD 48 are not reacted. In a subsequent process, another cleaning process may be performed, for example, using diluted HF as an etchant. The thickness of the isolation layer 66 on the sidewalls of the dielectric layer 50 and ILD 48 may be in the range between about 5 Å and about 10 Å.

Next, either the previously formed metal nitride layer is left as not removed, or the previously formed metal nitride layer is removed or pulled back, followed by the deposition of a new metal nitride layer (such as titanium nitride layer). The resulting metal nitride layer is shown as metal nitride layer 72. A metallic material 74 such as tungsten, cobalt, or the like, is then filled into contact openings 60. The formation process of metallic material 74 may include depositing a seed layer (W, Co, or the like), and plating a metal such as tungsten, cobalt, or the like, for example, through electrochemical plating (ECP). The respective process is illustrated as process 234 in the process flow 200 as shown in FIG. 19.

Figure 15A:
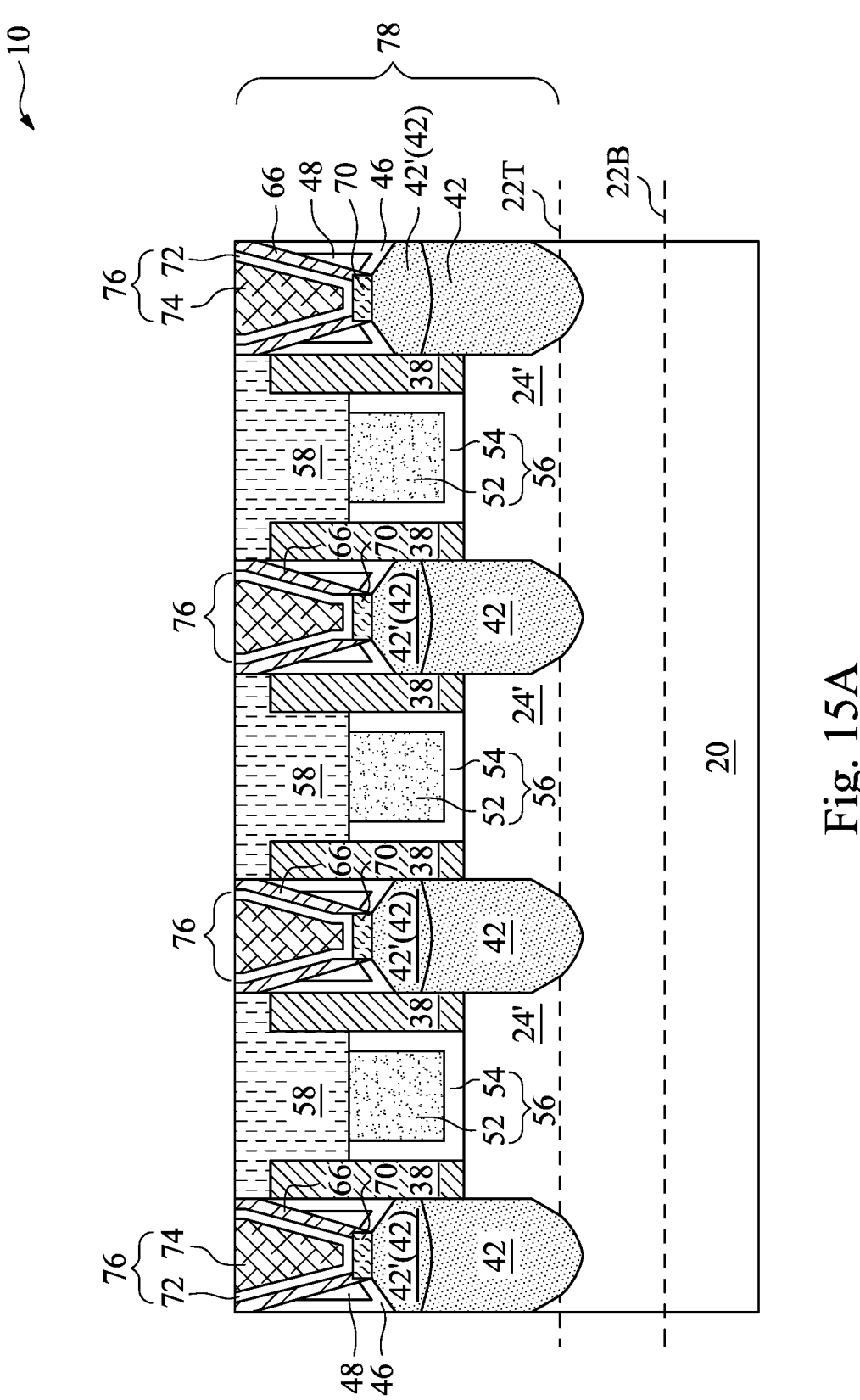
Figure 15B:
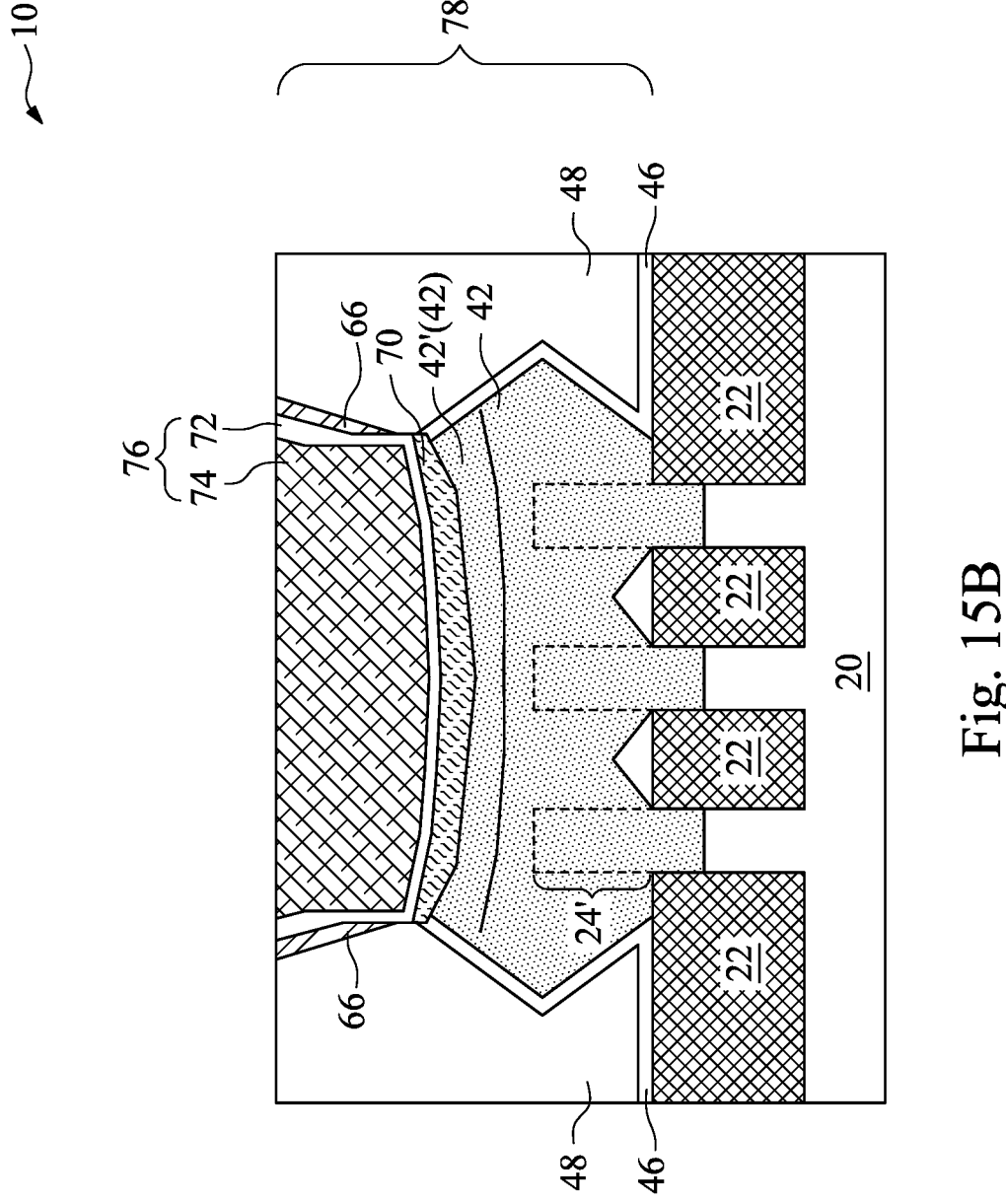
Figure 15C:
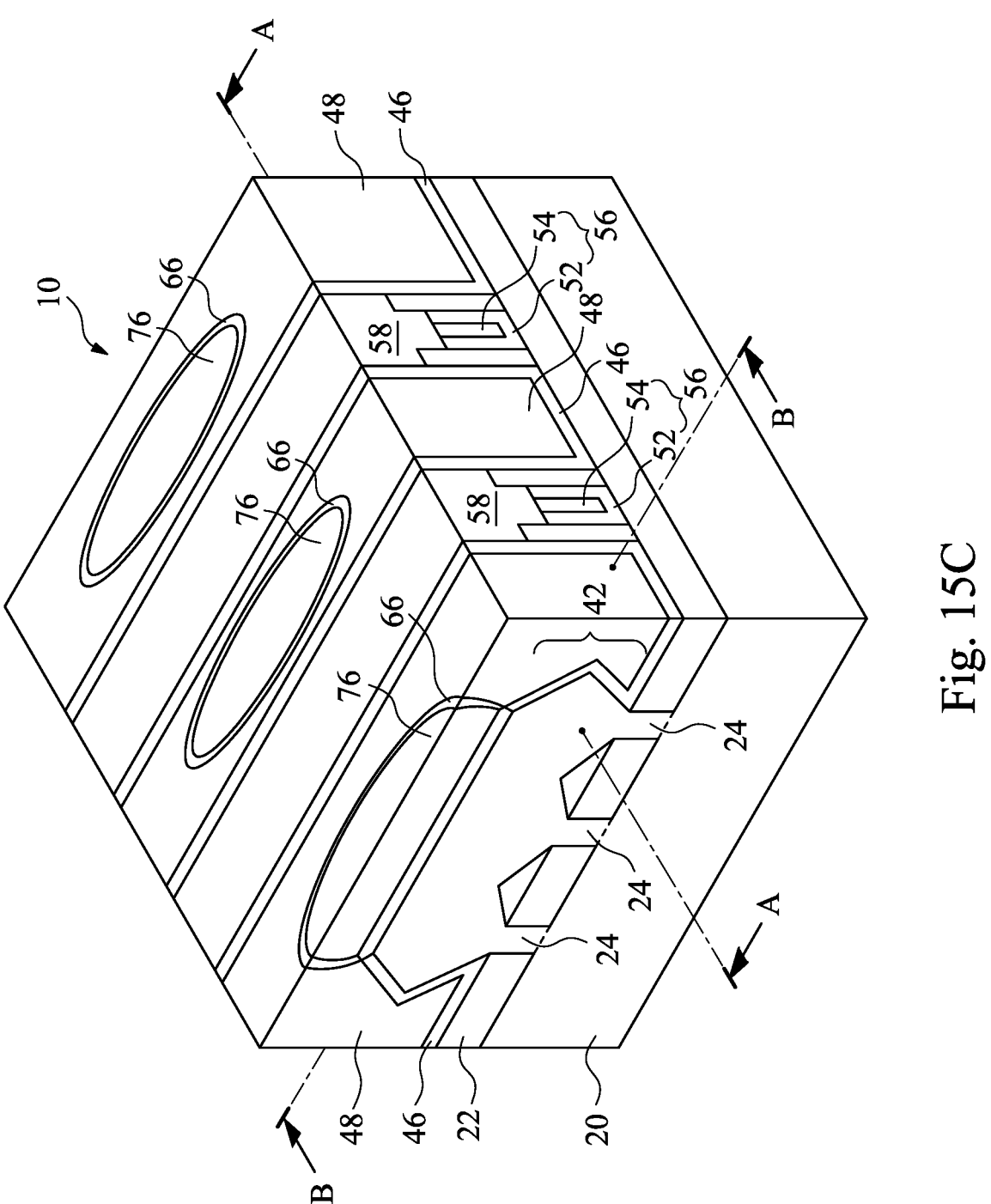

Next, a planarization process is performed to remove excess portions of metallic material 74 and metal nitride layer 72, resulting in source/drain contact plugs 76. In accordance with some embodiments, dielectric layer 50 is removed, as shown in FIGS. 15A and 15B. The respective process is illustrated as process 236 in the process flow 200 as shown in FIG. 19. In accordance with alternative embodiments, the planarization process is stopped on the top surface of dielectric layer 50. Source/drain contact plugs 76 includes the remaining portions of the metal layer, metal nitride layer 72, and metallic material 74. FinFETs 78 are thus formed. FIG. 15C illustrates a perspective view of FinFETs 78, wherein FIGS. 15A and 15B illustrate the cross-sections 15A-15A and 15B-15B in FIG. 15C.

Figure 16A:
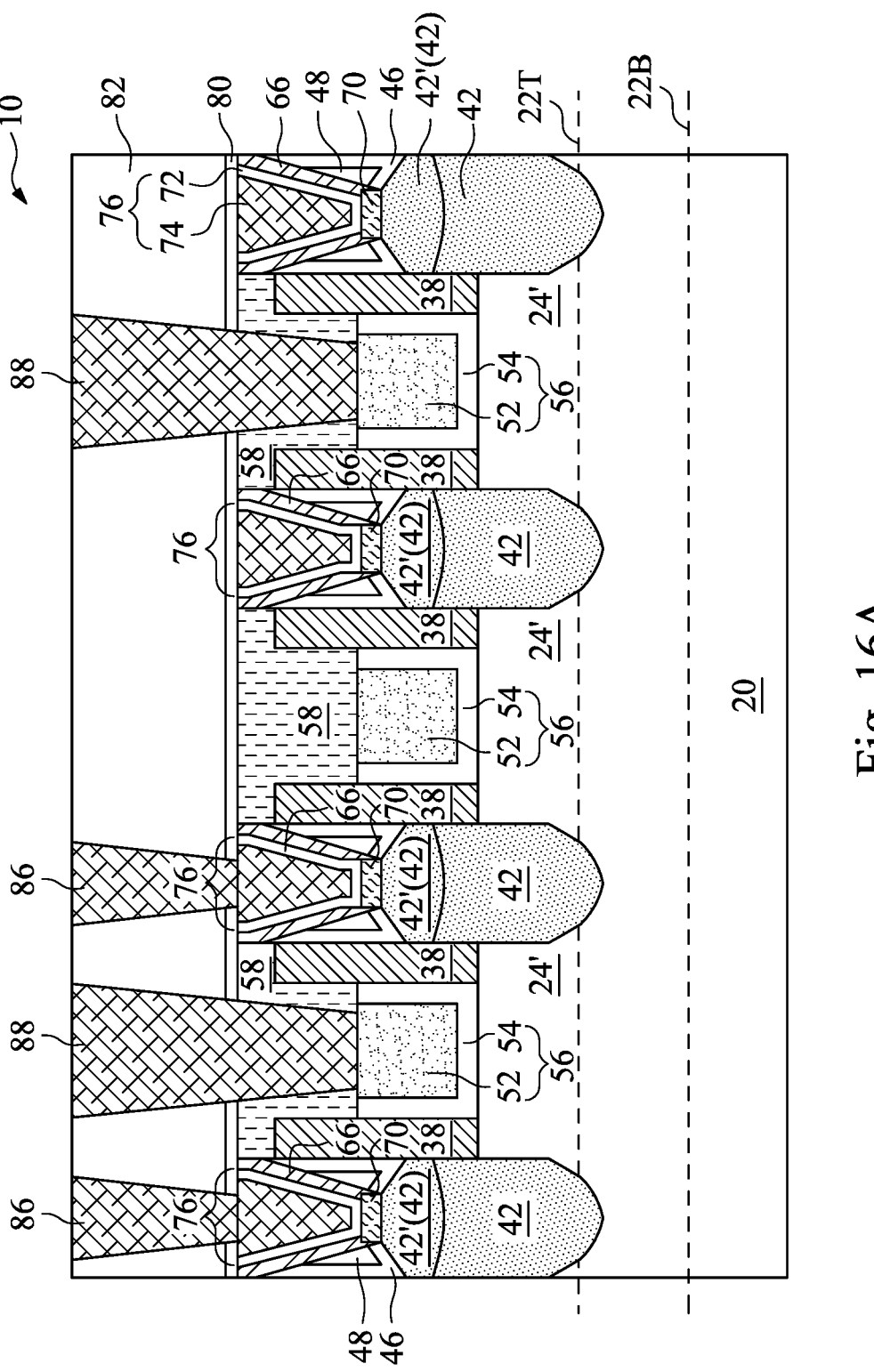
Figure 16B:
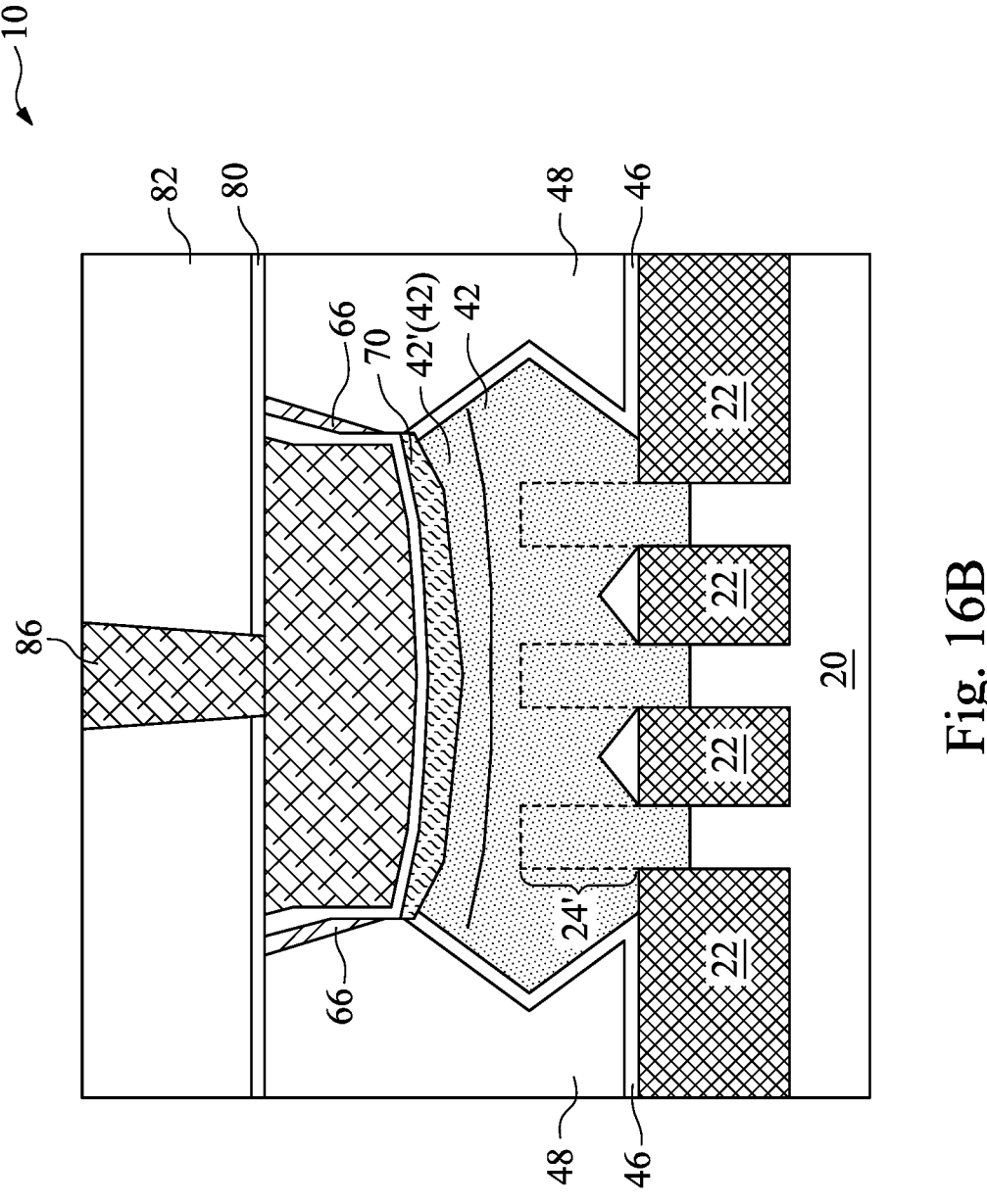

Referring to FIGS. 16A and 16B, etch stop layer 80 and ILD 82 are formed. The respective process is illustrated as process 238 in the process flow 200 as shown in FIG. 19. Etch stop layer 80 may be formed of AlO, AlN, SiN, SiCN, SiC, SiOCN, or the like, or combinations thereof. The formation method may include PECVD, ALD, CVD, or the like. Next, ILD 82 is formed over etch stop layer 80. The material of ILD 82 may be selected from the same candidate materials (and methods) for forming ILD 48. In accordance with some embodiments, ILD 82 is formed using PECVD, FCVD, spin-on coating, or the like.

ILD 82 and etch stop layer 80 are then etched to form openings. The etching may be performed using, for example, Reactive Ion Etch (RIE). In a subsequent process, upper source/drain contact plugs 86 and gate contact plugs 88 are formed. The respective process is illustrated as process 240 in the process flow 200 as shown in FIG. 19. In accordance with some embodiments of the present disclosure, source/drain contact plugs 86 and gate contact plugs 88 include barrier layers and a metal-containing material over the corresponding barrier layers.

As shown in FIG. 16A, source/drain contact plugs 76 are close to neighboring gate contact plugs 88, and there may be leakage currents flowing between them. Isolation layer 66 blocks the leakage paths, and reduces the leakage currents. Experiment results have revealed that isolation layer 66 may withstand breakdown voltage higher than 6 MV/cm. The leakage current that occurs when an electrical field of 2 MV/cm is applied on isolation layer 66 is found to be smaller than 1E-6 A/cm$^2$.

In accordance with some embodiments, as shown in FIGS. 16A and 16B, the upper portions of isolation layer 66 are thicker than the respective lower portions. Also, the change in the thickness may be continuous. The bottoms of isolation layers 66 may contact the respective silicide regions 70, or may be higher than, and may be spaced apart from the respective silicide regions 70.

Figure 17:
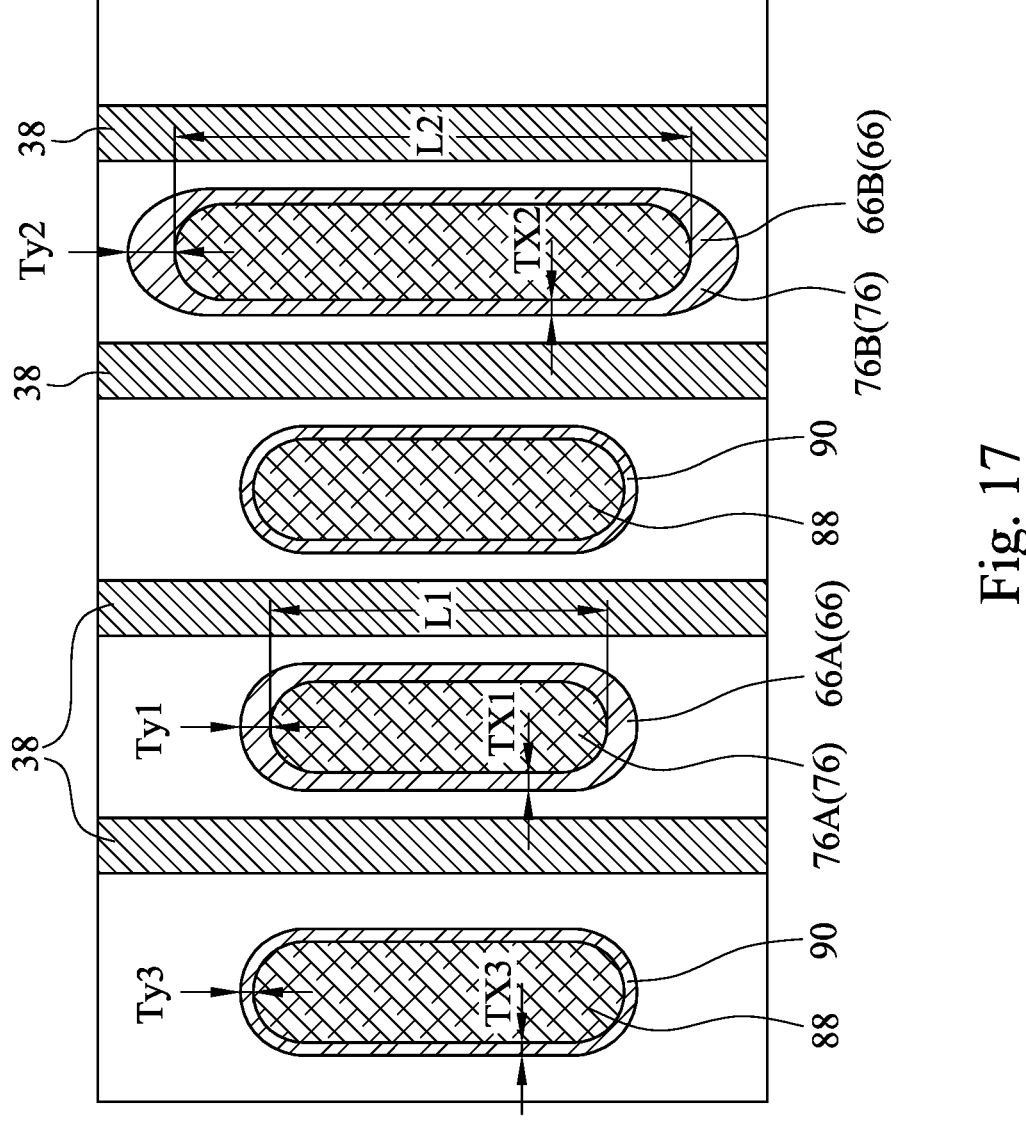
Figure 18:
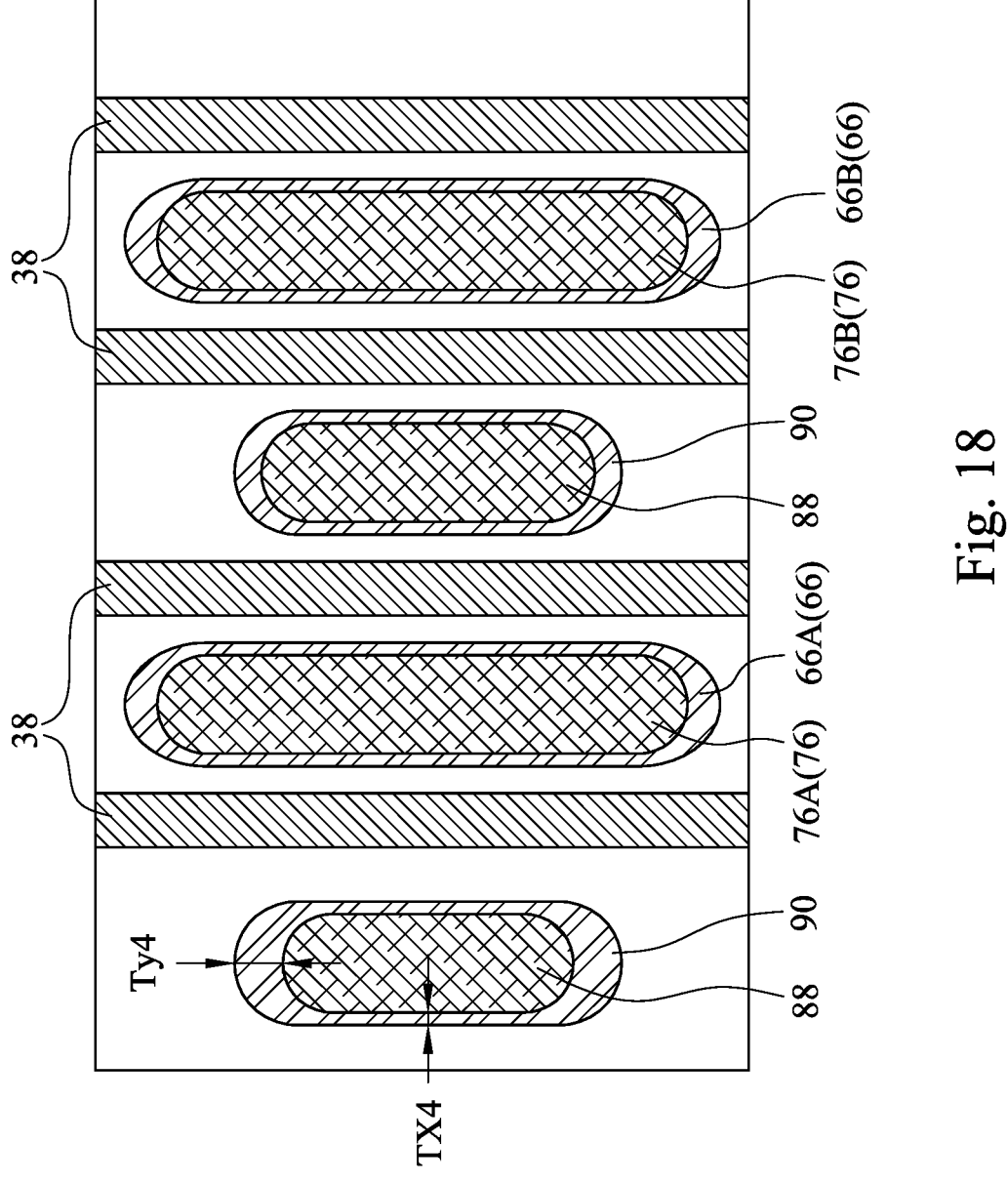
Figure 19:
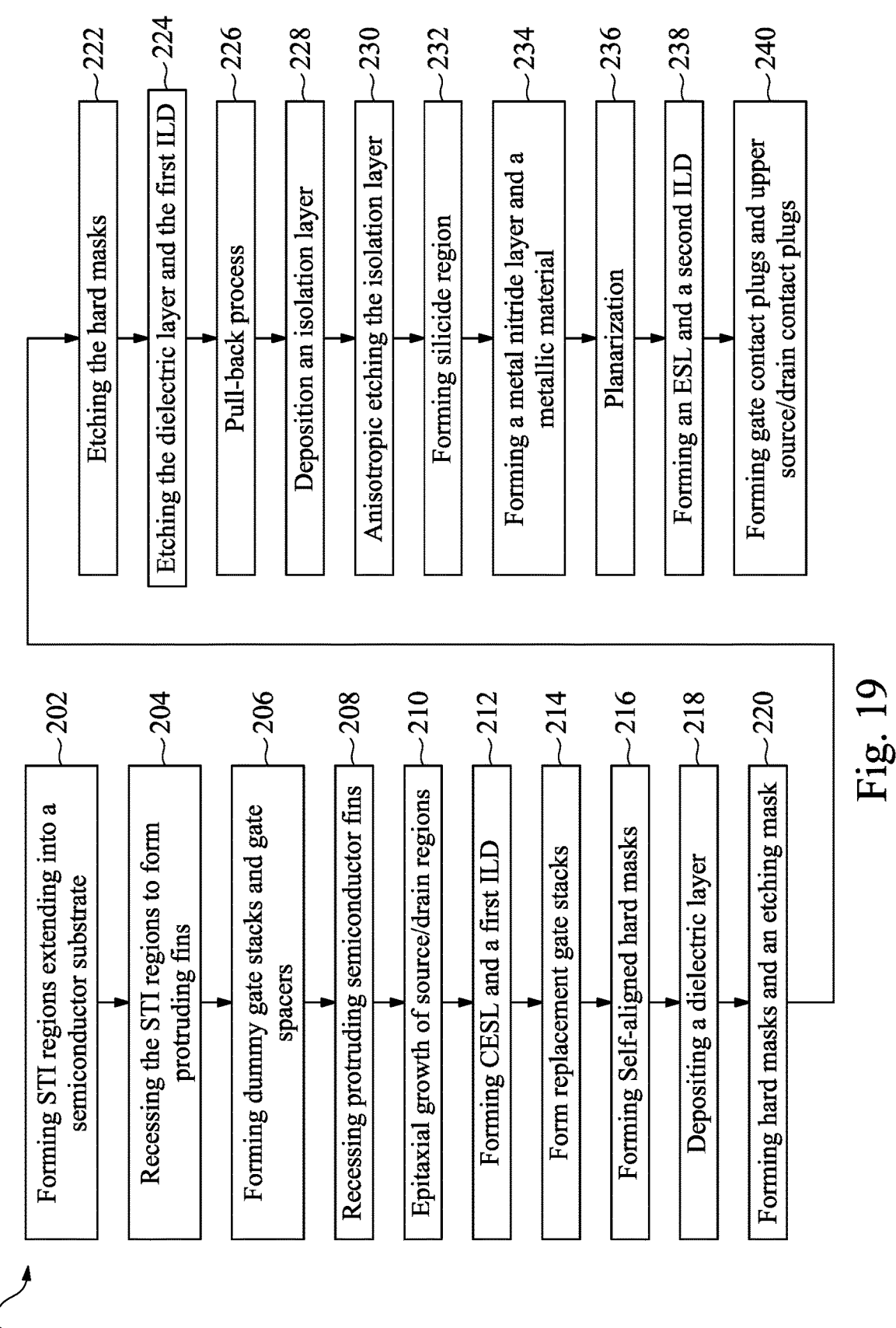
FIG. 19 illustrates a process flow for forming FinFETs in accordance with some embodiments.

FIGS. 17 and 18 illustrate the top views of source/drain contact plugs 76 (including 76A and 76B) and the corresponding isolation layers 66 in accordance with some embodiments. In the top view, each isolation layer 66 forms a ring encircling the corresponding source/drain contact plugs 76. Due to the elongated shape of openings 62 (FIGS. 13A and 13B) and the difference in slant angles α1' (FIG. 10B) and α2' (FIG. 11B), isolation layers 66 have non-uniform thicknesses. The portions of isolation layer 66 close to the ends of the elongated source/drain contact plugs 76 are thicker than the isolation layer 66 at the middle portions of the elongated source/drain contact plugs 76. For example, isolation layer 66A, which surrounds source/drain contact plugs 76A, has middle thickness Tx1 and end thickness Ty1. Isolation layer 66B, which surrounds source/drain contact plugs 76B, has middle thickness Tx2 and end thickness Ty2. Thicknesses Tx1 and Tx2 may be in the range between about 5 Å and about 30 Å. Both of ratio Ty1/Tx1 and Ty1/Tx1 are greater than 1.0, and may be in the range between 1.0 and about 1.3, and may be between 1.0 and about 1.5, or between about 1.2 and about 1.5.

Furthermore, the isolation layer surrounding a longer source/drain contact plug has a greater Ty/Tx value than a shorter source/drain contact plug. For example, as shown in FIGS. 17 and 18, the length L2 of source/drain contact plug 76B is greater than length L1 of source/drain contact plug 76A. Accordingly, ratio Ty2/Tx2 is greater than ratio Ty1/Tx1. Furthermore, the top view shape of longer source/drain contact plugs (such as 76B) have sharper ends than the shorter source/drain contact plugs (such as 76A). The thicknesses as shown in FIGS. 17 and 18 may be the thicknesses of the top portions of the corresponding isolation layers.

Furthermore, as shown in FIGS. 17 and 18, isolation layers 90 may also be formed surrounding gate contact plugs 88. The corresponding formation process may be the same as or different from the formation of isolation layers 66, for example, including etching the corresponding dielectric layer. Pull-back processes may be performed (or not performed). As a result, depending on different formation processes, the resulting isolation layer 90 may have the middle thickness Tx3 equal to end thickness Ty3, as shown in FIG. 17. Alternatively, as shown in FIG. 18, isolation layer 90 may have the middle thickness Tx4 smaller than end thickness Ty4.

The embodiments of the present disclosure have some advantageous features. By forming isolation layers, the leakage between source/drain contact plugs and nearby source/drain contact plugs and gate contact plugs are reduced. Furthermore, making the isolation layers to be slanted, and the thickness of the top portion of isolation layers to be greater than the lower portions improve the leakage isolation ability since the top portions are closer to the nearby metal features, and suffer from greater leakage problems than lower portions.

In accordance with some embodiments of the present disclosure, a method comprises forming a gate stack on a semiconductor region; forming a source/drain region, wherein the gate stack and the source/drain region are adjacent to each other; forming a contact etch stop layer over the source/drain region; forming an inter-layer dielectric over the contact etch stop layer; performing a first etching process to etch the inter-layer dielectric and the contact etch stop layer to form a contact opening, wherein the source/drain region is exposed to the contact opening; after the contact opening is formed, performing a second etching process, wherein after the second etching process, a sidewall of the inter-layer dielectric facing the contact opening is more slanted than before the second etching process; depositing an isolation layer extending into the contact opening; etching the isolation layer to remove a portion of the isolation layer that is on the source/drain region; forming a silicide region on the source/drain region; and filling the contact opening with a source/drain contact plug.

In an embodiment, the isolation layer is deposited as having lower portions thinner than upper portions. In an embodiment, the first etching process comprises an anisotropic etching process. In an embodiment, in a top view of the contact opening, the contact opening is elongated, and the isolation layer comprises an end portion at an end of the contact opening, and a middle portion between opposing ends of the contact opening, and wherein the end portion is thicker than the middle portion. In an embodiment, the second etching process comprises an isotropic etching effect. In an embodiment, the second etching process further comprises an anisotropic etching effect.

In an embodiment, the method further comprises forming a self-aligned hard mask over the gate stack, wherein after the second etching process, the self-aligned hard mask is exposed. In an embodiment, in the second etching process, the self-aligned hard mask is used as a part of an etch stop layer. In an embodiment, the method further comprises forming gate spacers, wherein the gate stack is between the gate spacers, and wherein in the second etching process, one of the gate spacers is exposed. In an embodiment, after the isolation layer is etched, a thin layer of the isolation layer is left over the source/drain region, and wherein the method further comprises, performing a cleaning process to remove the thin layer of the isolation layer.

In accordance with some embodiments of the present disclosure, a structure comprises a gate stack over a semiconductor region; a first source/drain region on a side of the gate stack; a contact etch stop layer over a part of the first source/drain region; an inter-layer dielectric over the contact etch stop layer; a first silicide region over the first source/drain region; a first source/drain contact plug over and contacting the first silicide region; and a first isolation layer encircling the first source/drain contact plug, wherein in a top view of the first source/drain contact plug, the first source/drain contact plug is elongated, and the first isolation layer comprises an end portion at an end of the first source/drain contact plug; and a middle portion between opposing ends of the first source/drain contact plug, wherein a first end-portion thickness of the end portion is greater than a first middle-portion thickness of the middle portion.

In an embodiment, a ratio of the first end-portion thickness to the first middle-portion thickness is in a range between about 1.2 and about 1.5. In an embodiment, the structure further comprises a hard mask overlapping the gate stack, wherein the first isolation layer contacts the hard mask. In an embodiment, the structure further comprises gate spacers on opposing sides of the gate stack, and wherein the hard mask overlaps the gate spacers. In an embodiment, the structure further comprises a second source/drain region; a second source/drain contact plug over and electrically connecting to the second source/drain region; and a second isolation layer encircling the second source/drain contact plug, wherein in a top view of the second source/drain contact plug, the second source/drain contact plug is elongated and longer than the first source/drain contact plug, and wherein a first ratio of the first end-portion thickness to the first middle-portion thickness is smaller than a second ratio of a second end-portion thickness to a second middle-portion thickness of the second isolation layer.

In accordance with some embodiments of the present disclosure, a structure comprises a gate stack over a semiconductor region; gate spacers on opposite sides of the gate stack; a hard mask comprising a first portion over one of the gate spacers, and a second portion extending between the gate spacers; a source/drain contact plug on a side of the gate stack; and an isolation layer encircling the source/drain contact plug, wherein in a top-view of the structure, the isolation layer has a non-uniform thickness. In an embodiment, the structure further comprises a silicide region underlying and contacting the source/drain contact plug, wherein the isolation layer is spaced apart from the silicide region. In an embodiment, the isolation layer comprises an upper portion having a first thickness, and a lower portion lower than the upper portion, wherein the lower portion has a second thickness smaller than the first thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a gate stack on a semiconductor region;
forming a source/drain region, wherein the gate stack and the source/drain region are adjacent to each other;
forming a contact etch stop layer over the source/drain region;
forming an inter-layer dielectric over the contact etch stop layer;
performing a first etching process to etch the inter-layer dielectric and the contact etch stop layer to form a contact opening, wherein the source/drain region is exposed to the contact opening;
after the contact opening is formed, performing a second etching process, wherein after the second etching process, a sidewall of the inter-layer dielectric facing the contact opening is more slanted than before the second etching process;
depositing an isolation layer extending into the contact opening;
etching the isolation layer to remove a portion of the isolation layer that is on the source/drain region;
forming a silicide region on the source/drain region; and
filling the contact opening with a source/drain contact plug.

2. The method of claim 1, wherein the isolation layer is deposited as having lower portions thinner than upper portions.

3. The method of claim 1, wherein the first etching process comprises an anisotropic etching process.

4. The method of claim 1, wherein in a top view of the contact opening, the contact opening is elongated, and the isolation layer comprises an end portion at an end of the contact opening, and a middle portion between opposing ends of the contact opening, and wherein the end portion is thicker than the middle portion.

5. The method of claim 4, wherein the second etching process comprises an isotropic etching effect.

6. The method of claim 5, wherein the second etching process further comprises an anisotropic etching effect.

7. The method of claim 1 further comprising forming a self-aligned hard mask over the gate stack, wherein after the second etching process, the self-aligned hard mask is exposed.

8. The method of claim 7, wherein in the second etching process, the self-aligned hard mask is used as a part of an etch stop layer.

9. The method of claim 7 further comprising forming gate spacers, wherein the gate stack is between the gate spacers, and wherein in the second etching process, one of the gate spacers is exposed.

10. The method of claim 1, wherein after the second etching process, the sidewall of the inter-layer dielectric has a tilt angle greater than about 5.5 degrees.

11. The method of claim 1, wherein after the isolation layer is etched, a thin layer of the isolation layer is left over the source/drain region, and wherein the method further comprises, performing a cleaning process to remove the thin layer of the isolation layer.

12. A method comprising:
forming a first source/drain region, wherein the first source/drain region is aside of a gate stack;
forming a contact etch stop layer over a part of the first source/drain region;
forming an inter-layer dielectric over the contact etch stop layer;
forming a first silicide region over the first source/drain region;
forming a first source/drain contact plug over and contacting the first silicide region; and
forming a first isolation layer, wherein the first isolation layer encircles the first source/drain contact plug, wherein in a top view of the first source/drain contact plug, the first source/drain contact plug is elongated, and the first isolation layer comprises:
an end portion at an end of the first source/drain contact plug; and
a middle portion between opposing ends of the first source/drain contact plug, wherein a first end-portion thickness of the end portion is greater than a first middle-portion thickness of the middle portion.

13. The method of claim 12, wherein a ratio of the first end-portion thickness to the first middle-portion thickness is in a range between about 1.2 and about 1.5.

14. The method of claim 12, wherein the first isolation layer has a slant angle greater than about 5.0 degrees.

15. The method of claim 12 further comprising forming a hard mask overlapping the gate stack, wherein the first isolation layer contacts the hard mask.

16. The method of claim 15 further comprising forming gate spacers, with the gate stack being between the gate spacers, wherein the hard mask overlaps the gate spacers.

17. The method of claim 12 further comprising:

forming a second source/drain region;

forming a second source/drain contact plug over and electrically connecting to the second source/drain region; and forming a second isolation layer encircling the second source/drain contact plug, wherein in a top view of the second source/drain contact plug, the second source/drain contact plug is elongated and longer than the first source/drain contact plug, and wherein a first ratio of the first end-portion thickness to the first middle-portion thickness is smaller than a second ratio of a second end-portion thickness to a second middle-portion thickness of the second isolation layer.

18. The method of claim 12, wherein the first isolation layer has a first top end higher than a second top end of a gate spacer, and wherein the gate spacer contacts the first isolation layer.

19. A method comprising:

forming gate spacers over a semiconductor region;

forming a gate stack over the semiconductor region, wherein the gate spacers are on opposite sides of the gate stack;

forming a hard mask comprising a first portion over one of the gate spacers, and a second portion between the gate spacers;

forming a silicide region;

forming a source/drain contact plug overlying and contacting the silicide region, wherein the source/drain contact plug is aside of the gate stack; and forming an isolation layer, wherein the isolation layer is spaced apart from the silicide region, wherein after both of the source/drain contact plug and the isolation layer are formed, the isolation layer encircles the source/drain contact plug, and wherein in a top-view of the isolation layer, the isolation layer has a non-uniform thickness.

20. The method of claim 19, wherein the isolation layer comprises an upper portion having a first thickness, and a lower portion lower than the upper portion, wherein the lower portion has a second thickness smaller than the first thickness.

* * * * *